(12) United States Patent
Cheng et al.

(10) Patent No.: US 10,522,486 B2
(45) Date of Patent: Dec. 31, 2019

(54) CONNECTOR FORMATION METHODS AND PACKAGED SEMICONDUCTOR DEVICES

(71) Applicant: Taiwan Semiconductor Manufacturing Company, Ltd., Hsinchu (TW)

(72) Inventors: Jung Wei Cheng, Hsinchu (TW); Hai-Ming Chen, Kaohsiung (TW); Chien-Hsun Lee, Hsinchu (TW); Hao-Cheng Hou, Hsinchu (TW); Hung-Jen Lin, Tainan (TW); Chun-Chih Chuang, Taichung (TW); Ming-Che Liu, Hsinchu (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/633,660

(22) Filed: Jun. 26, 2017

(65) Prior Publication Data

US 2017/0352632 A1 Dec. 7, 2017

Related U.S. Application Data

(63) Continuation of application No. 14/929,016, filed on Oct. 30, 2015, now Pat. No. 9,691,723.

(51) Int. Cl.
*H01L 23/00* (2006.01)
*H01L 25/065* (2006.01)
(Continued)

(52) U.S. Cl.
CPC .............. *H01L 24/03* (2013.01); *H01L 21/31* (2013.01); *H01L 21/31111* (2013.01); *H01L 21/31144* (2013.01); *H01L 21/32051* (2013.01); *H01L 23/528* (2013.01); *H01L 23/5226* (2013.01); *H01L 24/09* (2013.01); *H01L 25/0657* (2013.01); *H01L 2224/0362* (2013.01); *H01L 2224/03502* (2013.01); *H01L 2224/0603* (2013.01); *H01L 2224/0812* (2013.01);
(Continued)

(58) Field of Classification Search
USPC .......................................... 257/762; 438/652
See application file for complete search history.

(56) References Cited

U.S. PATENT DOCUMENTS 7,564,115 B2 7/2009 Chen et al.
7,633,165 B2 12/2009 Hsu et al.
(Continued)

*Primary Examiner* — Zandra V Smith
*Assistant Examiner* — Lawrence C Tynes, Jr.
(74) *Attorney, Agent, or Firm* — Slater Matsil, LLP

(57) ABSTRACT

Methods of forming connectors and packaged semiconductor devices are disclosed. In some embodiments, a connector is formed by forming a first photoresist layer over an interconnect structure, and patterning the first photoresist layer. The patterned first photoresist layer is used to form a first opening in an interconnect structure. The patterned first photoresist is removed, and a second photoresist layer is formed over the interconnect structure and in the first opening. The second photoresist layer is patterned to form a second opening over the interconnect structure in the first opening. The second opening is narrower than the first opening. At least one metal layer is plated through the patterned second photoresist layer to form the connector.

20 Claims, 15 Drawing Sheets

(51) Int. Cl.
*H01L 21/311* (2006.01)
*H01L 21/3205* (2006.01)
*H01L 23/522* (2006.01)
*H01L 23/528* (2006.01)
*H01L 21/31* (2006.01)

(52) U.S. Cl.
CPC ............... *H01L 2224/0903* (2013.01); *H01L 2225/06548* (2013.01)

(56) References Cited

U.S. PATENT DOCUMENTS

| | | | |
|---|---|---|---|
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,361,842 B2 | 1/2013 | Yu et al. | |
| 8,426,961 B2 | 4/2013 | Shih et al. | |
| 8,669,174 B2 | 3/2014 | Wu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,802,504 B1 | 8/2014 | Hou et al. | |
| 8,803,292 B2 | 8/2014 | Chen et al. | |
| 8,803,306 B1 | 8/2014 | Yu et al. | |
| 8,803,316 B2 | 8/2014 | Lin et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2006/0109069 A1 | 5/2006 | Chou | |
| 2007/0194450 A1* | 8/2007 | Tyberg | H01L 23/5226 257/751 |
| 2008/0171174 A1* | 7/2008 | Trezza | H01L 21/6835 428/119 |
| 2010/0246152 A1* | 9/2010 | Lin | H01L 21/563 361/783 |
| 2011/0026232 A1* | 2/2011 | Lin | H01L 23/5226 361/760 |
| 2011/0128665 A1* | 6/2011 | Nies | C04B 35/462 361/301.4 |
| 2011/0291288 A1 | 12/2011 | Wu et al. | |
| 2011/0306214 A1* | 12/2011 | Zin | H01J 37/32082 438/714 |
| 2012/0074580 A1* | 3/2012 | Nalla | H01L 21/568 257/774 |
| 2012/0248609 A1* | 10/2012 | Tomita | H01L 21/76804 257/751 |
| 2013/0026468 A1 | 1/2013 | Yoshimuta et al. | |
| 2013/0049218 A1 | 2/2013 | Gong et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0001645 A1 | 1/2014 | Lin et al. | |
| 2014/0076699 A1 | 3/2014 | Rogers et al. | |
| 2014/0203429 A1 | 7/2014 | Yu et al. | |
| 2014/0225222 A1 | 8/2014 | Yu et al. | |
| 2014/0225258 A1 | 8/2014 | Chiu et al. | |
| 2014/0252572 A1 | 9/2014 | Hou et al. | |
| 2014/0252646 A1 | 9/2014 | Hung et al. | |
| 2014/0264930 A1 | 9/2014 | Yu et al. | |
| 2015/0061127 A1 | 3/2015 | Chen et al. | |
| 2015/0348895 A1* | 12/2015 | Sen | H01L 24/48 257/774 |
| 2016/0300789 A1* | 10/2016 | Chen | H01L 21/56 |

* cited by examiner

190

191
PROVIDE A PACKAGED SEMICONDUCTOR DEVICE 100 INCLUDING AN INTEGRATED CIRCUIT DIE 104, A MOLDING MATERIAL 108 DISPOSED AROUND THE INTEGRATED CIRCUIT DIE 104, AND AN INTERCONNECT STRUCTURE 110 DISPOSED OVER THE INTEGRATED CIRCUIT DIE 104 AND THE MOLDING MATERIAL 108

192
FORM OPENINGS 117' IN AN INSULATING MATERIAL LAYER 116 OF THE INTERCONNECT STRUCTURE 110, EACH OF THE OPENINGS 117' BEING OVER A CONNECTOR MOUNTING REGION 132 OF THE INTERCONNECT STRUCTURE 110, EACH OF THE CONNECTOR MOUNTING REGIONS 132 INCLUDING A CONDUCTIVE FEATURE OF THE INTERCONNECT STRUCTURE 110 AND HAVING A FIRST WIDTH $d_2$ AND A SUBSTANTIALLY PLANAR SURFACE

193
FORM A CONNECTOR 140' USING A PLATING PROCESS OVER EACH OF THE CONNECTOR MOUNTING REGIONS 132, THE CONNECTORS 140' HAVING A SECOND WIDTH $d_5$, THE SECOND WIDTH $d_5$ BEING LESS THAN THE FIRST WIDTH $d_2$

CONNECTOR FORMATION METHODS AND PACKAGED SEMICONDUCTOR DEVICES

PRIORITY CLAIM AND RELATED APPLICATIONS

This application is a continuation of U.S. patent application Ser. No. 14/929,016 entitled "CONNECTOR FORMATION METHODS AND PACKAGED SEMICONDUCTOR DEVICES," filed on 30 Oct. 2015, which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also employ smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post-passivation interconnect (PPI) that is used to fan-out wiring for contact pads of the package so that electrical contacts may be made on a larger pitch than contact pads of the integrated circuit. WLPs are often used to package integrated circuits (ICs) that demand high speed, high density, and greater pin count, as examples. Connectors may be coupled to contact pads of the package for connection to a device or object.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 is a flow chart that illustrates a method of forming connectors on a packaged semiconductor device in accordance with some embodiments of the present disclosure.

DETAILED DESCRIPTION

Figure 1:
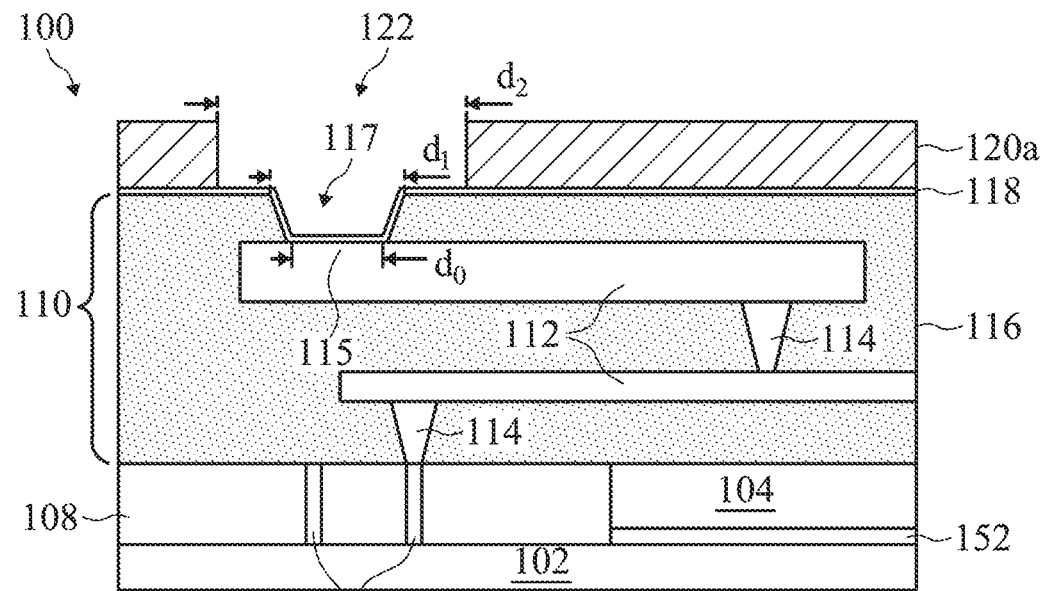
FIGS. 1, 2, 3a, 3b, 4a, 4b, 5, and 6 are cross-sectional views of a portion of a packaged semiconductor device at various stages that illustrate methods of forming connectors in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of forming connectors and packaged semiconductor devices that include the connectors are disclosed in the present disclosure. In some embodiments, the connectors are formed using plating processes over connector mounting regions that have a substantially flat surface, which prevents underdevelopment during lithography processes. In some embodiments, the connectors are wider at the bottom proximate an interconnect structure that the connectors are formed on than at the top, which provides a wider solder bridge joint formation process window. Some embodiments are disclosed that utilize connectors that may be used for the purpose of attaching one substrate to another substrate, wherein the substrates may be a die, wafer, printed circuit board (PCB), packaging substrate, or the like, thereby allowing for die-to-die, wafer-to-die, wafer-to-wafer, die or wafer to printed circuit board, packaging substrate types of packaging, or the like. Throughout the various views and illustrative embodiments, like reference numerals are used to designate like elements.

In some embodiments, one or more carriers 102 are used in a packaging process for a semiconductor device and during a subsequent connector formation for the package. Referring first to FIGS. 1, 2, 3a, 3b, 4a, 4b, 5, and 6, which are cross-sectional views of a portion of a packaged semiconductor device 100 at various stages of a connector formation process, a method of packaging a semiconductor device and forming connectors 140 on an interconnect structure 110 of the packaged semiconductor device 100 in accordance with some embodiments of the present disclosure is shown. A molding material 108 and components within the molding material 108 are first formed over a carrier 102, an interconnect structure 110 is formed over the molding material 108 and components within the molding material 108, and then connectors 140 (see FIG. 6) are formed over the interconnect structure 110 in some embodiments. The order of the packaging process and connector 140 formation process may vary and may also comprise other orders of processing steps, some of which will be described further herein.

To package a semiconductor device, a carrier 102 is provided, as shown in FIG. 1. The carrier 102 may comprise a glass carrier substrate, a ceramic carrier substrate, a wafer such as a semiconductor wafer, a tape, or the like. The carrier 102 is later removed after the packaging process and/or connector 140 formation process in some embodiments, for example. The carrier 102 may include a release layer (not shown) formed thereon which may comprise a polymer-based material. The release layer may be removed along with the carrier 102 from the overlying structures that will be formed in subsequent processing steps. In some embodiments, the release layer may comprise an epoxy-based thermal-release material, which loses its adhesive property when heated, such as a light-to-heat-conversion (LTHC) release coating. In other embodiments, the release layer may comprise an ultra-violet (UV) glue, which loses its adhesive property when exposed to UV light. The release layer may be dispensed as a liquid and cured, and may be a laminate film laminated onto the carrier 102, or the like. An adhesive (also not shown) may be formed or dispensed over the release layer. The adhesive may comprise a die attach film (DAF), a glue, a polymer material, or the like.

A plurality of through-vias 106 is formed over the carrier 102. Only two through-vias 106 are shown in FIG. 1; however, hundreds or thousands of through-vias 106 may be included in a packaged semiconductor device 100. The through-vias 106 are formed by plating in some embodiments. The through-vias 106 may also be formed using subtractive etch techniques, by forming a conductive material over the carrier 102, and patterning the conductive material using a lithography process. The through-vias 106 may also be formed using other methods. Each of the plurality of through-vias 106 may be positioned so that they will be coupled to a conductive portion of the interconnect structure 110, such as conductive lines 112 and/or conductive vias 114 that are later formed, for example. In some embodiments, the plurality of through-vias 106 is not included, which will be described further herein.

To form the plurality of through-vias 106 using a plating process, a seed layer, not shown, is formed over the carrier 102 (e.g., over the release film and/or the adhesive disposed over the carrier 102), in some embodiments. The seed layer comprises a metal layer, which may be a single layer or a composite layer comprising a plurality of sub-layers formed of different materials. In some embodiments, the seed layer comprises a titanium layer and a copper layer disposed over the titanium layer. The seed layer may be formed using, for example, sputtering, physical vapor deposition (PVD), or the like.

A sacrificial material, also not shown, is then formed on the seed layer and is patterned. The sacrificial material may comprise a photosensitive material such as a photoresist or an insulator that is photosensitive, as examples. The sacrificial material may be formed by spin coating or the like, and the sacrificial material may be patterned by exposure to light or energy reflected from or transmitted through a patterned lithography mask having a desired pattern thereon. The pattern of the sacrificial material corresponds to the pattern for through-vias 106 to be formed over the carrier 102 in some embodiments. The patterning of the sacrificial material forms openings through the sacrificial material, leaving portions of the seed layer exposed.

A conductive material is formed in the openings of the sacrificial material and on the exposed portions of the seed layer, forming the through-vias 106. The conductive material is formed by a plating process, such as electroplating or electroless plating, or the like. The conductive material may comprise a metal, such as copper, titanium, tungsten, aluminum, alloys, or multiple layers thereof, or the like.

Then, the sacrificial material and portions of the seed layer upon which the conductive material is not formed are removed. The sacrificial material may be removed by an acceptable ashing or stripping process, such as using an oxygen plasma or the like. An etch process may also be used to remove the sacrificial material, e.g., in some embodiments wherein a photosensitive insulating material is used for the sacrificial material. After the sacrificial material is removed, exposed portions of the seed layer are removed, such as by using an acceptable etching process, such as by wet or dry etching. The seed layer that was disposed beneath the sacrificial layer is removed, for example. The remaining portions of the seed layer and conductive material form the through-vias 106 shown in FIG. 1. The through-vias 106 provide vertical electrical connections for the packaged semiconductor device 100 in some embodiments, for example.

One or more integrated circuit dies 104 are then coupled to the carrier 102, also shown in FIG. 1. The integrated circuit die(s) 104 is attached to the carrier 102 by the adhesive or release film disposed on the carrier 102 in some embodiments, for example. In some embodiments, a DAF or adhesive 152 is applied to a bottom surface of the integrated circuit die(s) 104 or applied onto the carrier 102, and the integrated circuit die(s) 104 is then attached to the carrier 102 using the DAF or adhesive 152. The integrated circuit die(s) 104 may comprise a substrate having electrical circuitry formed within or thereon. The substrate may comprise, for example, doped or undoped bulk silicon or an active layer of a semiconductor-on-insulator (SOI) substrate. The electrical circuitry of the substrate of the integrated circuit die(s) 104 may be any type of circuitry suitable for a particular application. The integrated circuit die(s) 104 may comprise a logic, memory, processor, or other type of device. As other examples, electrical circuitry formed within or on the substrate of the integrated circuit die(s) 104 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other circuitry may be used as appropriate for a given application. The integrated circuit die(s) 104 typically has been fabricated by forming a plurality of the integrated circuit dies 104 on a semiconductor wafer, and singulating the individual integrated circuit dies 104 along scribe lines.

The molding material 108 is disposed over and around the through-vias 106 and integrated circuit die(s) 104, also shown in FIG. 1. The molding material 108 encapsulates the through-vias 106 and the integrated circuit die(s) 104 in some embodiments, for example. The molding material 108 may comprise a molding compound comprised of an insulating material, such as an epoxy, a filler material, a stress release agent (SRA), an adhesion promoter, other materials, or combinations thereof, as examples. The molding material 108 may comprise a liquid or gel when applied so that it flows between and around the through-vias 106 and the integrated circuit die(s) 104, in some embodiments. The molding material 108 is then cured or allowed to dry so that it forms a solid. A molding compound clamp may be applied during a curing process and a plasma treatment process of the molding material 108 in some embodiments. In some embodiments, as deposited, the molding material 108 extends over top surfaces of the through-vias 106 and the integrated circuit die(s) 104. After the molding material 108 is applied, a top portion of the molding material 108 is removed using a planarization process, such as a chemical mechanical polish (CMP) process, a grinding process, an etch process, or combinations thereof, as examples. Other methods may also be used to planarize the molding material 108. A top portion of the through-vias 106 and/or the integrated circuit die(s) 104 may also be removed during the planarization process for the molding material 108. In some embodiments, an amount of the molding material 108 applied may be controlled so that top surfaces of the through-vias 106 and integrated circuit die(s) 104 are exposed. Other methods may also be used to form the molding material 108.

Next, one or more conductive material layers and insulating material layers 116 of the interconnect structure 110 are sequentially formed over the molding material 108 in some embodiments. For example, the interconnect structure 110 may be formed over the planarized molding material 108, the through-vias 106, and the integrated circuit die(s) 104, as shown in FIG. 1. Conductive features of the interconnect structure 110 formed within the insulating material layers 116 may comprise conductive lines 112, conductive vias 114, landing pads 115, and/or other types of features that may comprise similar conductive materials and/or formation methods as described for the through-vias 106, for example.

The interconnect structure 110 may comprise a redistribution layer (RDL) or post-passivation interconnect (PPI) in some embodiments, for example. The interconnect structure 110 may include fan-out wiring wherein landing pads 115 of the interconnect structure 110 are spaced out farther apart and have a larger footprint than contact pads on the integrated circuit die(s) 104, for example. The interconnect structure 110 may also comprise other types of wiring. The interconnect structure 110 is formed using a wafer level package (WLP) process in some embodiments, for example. The interconnect structure 110 provides electrical connections in a horizontal direction for a packaged semiconductor device (see packaged semiconductor device 100 shown in FIG. 14) in some embodiments, for example.

The interconnect structure 110 includes two conductive line 112 layers and two conductive via 114 layers in the examples shown in FIGS. 1 through 13: the interconnect structure 110 may also include other numbers of conductive line 112 layers and conductive via 114 layers. The depiction of two conductive line 112 layers and two conductive via 114 layers in the interconnect structure 110 is for ease and simplicity of illustration. The interconnect structure 110 may include one or more conductive line 112 layers and one or more conductive via 114 layers. For example, in FIG. 14, an interconnect structure 110 includes three conductive line 112 layers and three conductive via 114 layers, and in FIG. 15, interconnect structure 110' includes one conductive line 112 layer and one conductive via 114 layer. Some of the conductive lines 112 and/or conductive vias 114 of the interconnect structure 110 are coupled to contact pads 154 of the integrated circuit die(s) 104, which is shown in FIG. 14.

Referring again to FIG. 1, one or more insulating material layers 116 are formed around the conductive lines 112 and the conductive vias 114, forming the interconnect structure 110. The insulating material layers 116 may comprise a polymer, such as polybenzoxazole (PBO), polyimide, benzocyclobutene (BCB), or the like. In some embodiments, the insulating material layers 116 may comprise a nitride such as silicon nitride; an oxide such as silicon oxide, phosphosilicate glass (PSG), borosilicate glass (BSG), boron-doped phosphosilicate glass (BPSG); combinations or multiple layers thereof; or the like. The insulating material layers 116 may be formed by any acceptable deposition process, such as spin coating, chemical vapor deposition (CVD), laminating, the like, or a combination thereof.

In some embodiments, the conductive lines 112, conductive vias 114, and landing pads 115 are formed using a plating process. For example, one or more insulating material layers 116 are formed over the molding material 108, through-vias 106, and integrated circuit die(s) 104, and the one or more insulating material layers 116 are patterned using lithography. Using a single damascene process, a seed layer may be formed and sacrificial material may be formed as described for the through-vias 106, and a conductive material may be plated over the seed layer through the patterned sacrificial material to form the conductive vias 114, conductive lines 112, and/or landing pads 115. The sacrificial material and exposed seed layer are then removed. A conductive via 114 layer and conductive line 112 layer may simultaneously be plated over a seed layer using a dual damascene process in some embodiments, as another example.

The process(es) described herein used to form the conductive features of the interconnect structure 110, such as the conductive via 114 layers and conductive line 112 layers of the interconnect structure 110, may be repeated for additional conductive via layers, conductive line layers, if any are included. One or more additional metallization patterns with conductive lines 112, conductive vias 114, and insulating material layers 116 may be formed in the interconnect structure 110 by repeating the processes described herein. Conductive vias 114 may be formed during the formation of a conductive line 112 pattern, or conductive lines 112 may be formed during the formation of a conductive via 114 pattern, e.g., in a dual damascene or plating process. The conductive vias 114 may interconnect and electrically couple the various conductive lines 112 and other metallization patterns in the various conductive feature layers of the interconnect structure 110.

The conductive lines 112 and conductive vias 114 may comprise a thin layer, e.g., comprising a thickness of about 2 µm to about 3 µm or less, of titanium or other seed material that is formed using a sputtering process, and a layer of copper, a copper alloy, or other metal that is electro-plated over the layer of titanium, in some embodiments. In other embodiments, the conductive lines 112 and conductive vias 114 may comprise a multi-layered structure, such as a copper layer coated with electro-less nickel or electro-less palladium immersion gold (ENEPIG), which includes a nickel layer, a palladium layer on the nickel layer, and a gold layer on the palladium layer. The gold layer may be formed using immersion plating. The conductive lines 112 and conductive vias 114 may also comprise other materials, dimensions, and formation methods. The insulating material layers 116 may be formed or disposed around the conductive lines 112 and conductive vias 114.

In some embodiments, the conductive lines 112 and conductive vias 114 may be deposited and patterned using a lithography process, similar to the lithography process described for the insulating material layers 116, using an etch chemistry suited for the material of the conductive lines 112 and conductive vias 114. For example, a conductive material may be formed as a blanket coating and then etched using a lithography process to pattern the conductive lines 112 and conductive vias 114. The conductive lines 112 and conductive vias 114 may be formed using subtractive etch processes, and the insulating material layers 116 are then formed around the conductive lines 112 and the conductive vias 114, forming the interconnect structure 110.

After the interconnect structure 110 is formed, a plurality of connectors 140 is formed over the interconnect structure 110 in accordance with some embodiments of the present disclosure, as illustrated in FIGS. 1 through 6, which show various stages of a connector 140 formation process in accordance with some embodiments. To form the plurality of connectors 140 over the interconnect structure 110, openings 117 are formed in an upper-most insulating material layer 116 of the interconnect structure 110. Only one opening 117 is shown in the drawings: a plurality of openings 117 may be formed in the interconnect structure 110, depending on the size of the packaged semiconductor device 100 and the number of connectors needed. Dozens, hundreds or more connectors may be used on a packaged semiconductor device 100, for example.

Figure 7:
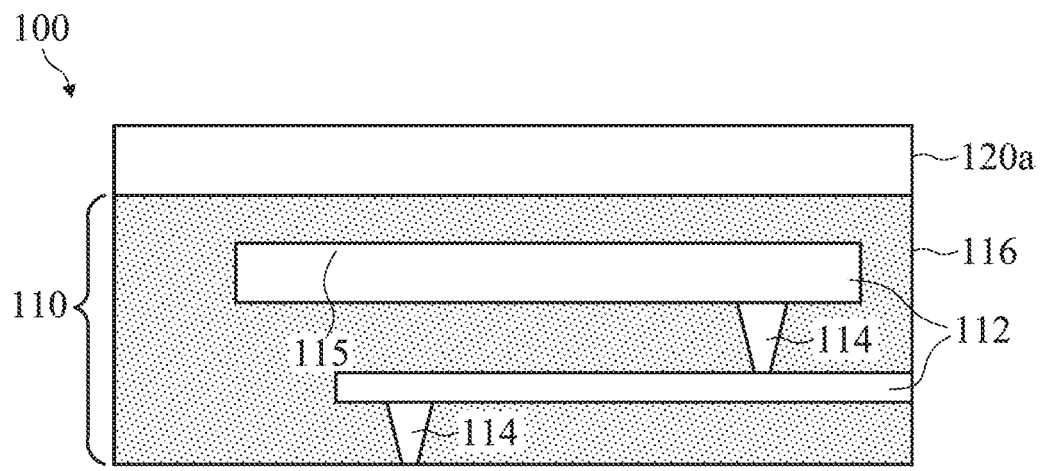
FIGS. 7 through 12 are cross-sectional views of a portion of a packaged semiconductor device at various stages that illustrate a method of forming connectors in accordance with some embodiments.
Figure 8:
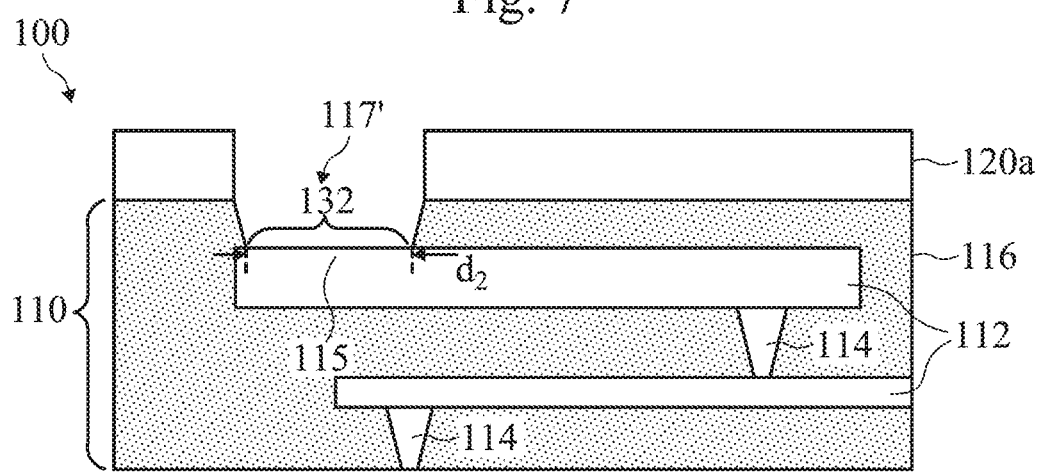

The openings 117 in the upper-most insulating material 116 of the interconnect structure 110 may be formed using a lithography process, e.g., by depositing a layer of photoresist (not shown in FIG. 1; see layer of photoresist 120a shown in FIG. 7), patterning the layer of photoresist with the desired pattern of the openings 117 (see FIG. 8), and using the layer of photoresist as an etch mask during an etch process, forming the openings 117 (FIG. 8). The layer of photoresist is then removed. The openings 117 may also be formed using a laser drilling process, as another example.

Referring again to FIG. 1, the openings 117 may have a width comprising dimension do proximate a conductive feature of the interconnect structure 110, such as a conductive line 112 or landing pad 115 that is coupled to a conductive line 112 or conductive via 114. The openings 117 may also be formed over conductive vias 114 of the interconnect structure no in some embodiments, not shown. The openings 117 in the insulating material layer 116 may have a width comprising dimension $d_1$ proximate a surface of the insulating material layer 116, wherein dimension $d_1$ is greater than dimension $d_0$, and the opening 117 has a tapered profile. The opening 117 may also have substantially straight sidewalls within the insulating material layer 116, wherein dimension $d_1$ is about the same as dimension $d_0$ (not shown). In some embodiments, dimensions $d_0$ and $d_1$ may comprise about 10 µm to about 35 µm, for example. Dimensions $d_0$ and $d_1$ may also comprise other dimensions.

The openings 117 may comprise a substantially circular shape in a top (or bottom) view of the packaged semiconductor device 100, not shown. The openings 117 may also comprise other shapes, such as oval, square, rectangular, polygonal, etc. The openings 117 may be formed over a portion of a conductive line 112 or over a portion of a landing pad 115 coupled to a conductive line 112 or via 114. The landing pads 115 may also comprise a circular, oval, square, rectangular, polygonal, or other shapes, for example. The landing pads 115 may comprise post-passivation interconnect (PPI) pads, contact pads, or other types of structures adapted to provide electrical connections to the interconnect structure 110, for example.

Note that in some embodiments, a packaged semiconductor device may be provided that has openings 117 formed over conductive features of the interconnect structure 110, so that the step of forming the openings 117 is not indicated to form the connectors 140.

A seed layer 118 is formed over the patterned upper-most insulating material layer 116 and over the exposed portion of the conductive feature, such as the conductive line 112, conductive via 114, or landing pad 115, as illustrated in FIG. 1. The seed layer 118 may comprise a few thousand Angstroms (A) of a conductive material such as copper or a copper alloy in some embodiments, for example. The seed layer 118 comprises a first layer having a thickness of about 0.5 kilo-Angstroms (kA) to about 3 kA of Ti and a second layer comprising about 3 kA to about 10 kA of copper disposed over the first layer in some embodiments, as another example. The seed layer 118 may also comprise other materials and dimensions.

A layer of photoresist 120a is formed over the seed layer 118, also shown in FIG. 1. The layer of photoresist 120a may comprise a thickness of about 10 µm to about 60 µ, in some embodiments, for example. The layer of photoresist 120a may also comprise other dimensions. The layer of photoresist 120a is also referred to herein as a first layer of photoresist 120a.

The layer of photoresist 120a is patterned using photolithography, forming openings 122 in the layer of photoresist 120a. The openings 122 are formed over the openings 117 in the insulating material layer 116 and extend laterally beyond a perimeter of the openings 117. The openings 122 may comprise a width comprising dimension $d_2$, wherein dimension $d_2$ comprises about 12 µm to about 40 µm in some embodiments. Dimension $d_2$ may comprise about 12 µm to about 40 µm in some microbump applications, for example. Dimension $d_2$ may be greater than 40 µm in other connector applications, such as controlled collapse chip connection ($C_4$) or ball grid array (BGA), as examples. Dimension $d_2$ may also comprise other dimensions. Dimension $d_2$ is also referred to herein a first width. The width of the openings 122 comprising dimension $d_2$ is larger than the width of the openings in the insulating material layer 116 comprising dimension $d_0$ in some embodiments, as illustrated in FIG. 1, for example. Dimension $d_2$ may be larger than dimension $d_0$ by about 5 µm to about 10 µm in some embodiments, for example. Dimension $d_2$ may also be larger than dimension $d_0$ by other amounts.

In FIGS. 2 through 5, and also in FIGS. 7 through 13, the carrier 102, molding material 108, through-vias 106, and integrated circuit die(s) 104 are not shown, to simplify the drawings. In some embodiments, the carrier 102 is removed after the formation of the connectors 140, for example. The carrier 102 may also be removed at other stages of the packaging and/or connector 140 formation process.

Figure 2:
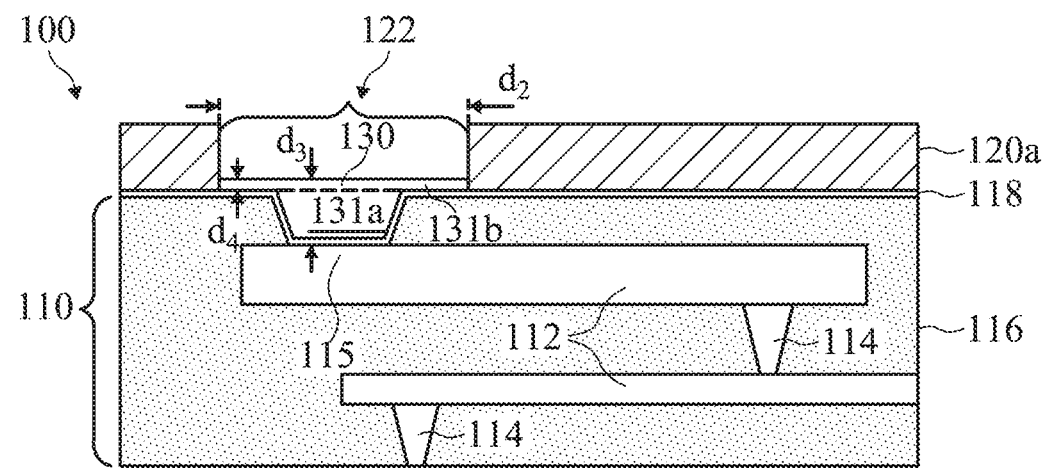

Referring next to FIG. 2, a conductive material such as Cu, Ni, or other metals, is plated over the seed layer 118 through the patterned layer of photoresist 120a. The conductive material comprises a first metal layer 130 in some embodiments, for example. The first metal layer 130 fills the opening 117 in the insulating material layer 116 and partially fills the opening 122 in the first layer of photoresist 120a. The first metal layer 130 comprises a first region disposed within the insulating material layer 116 and a second region disposed over the first region. Dimension $d_2$ of the opening in the layer of photoresist 120a is larger than dimension $d_1$, so a portion of the second region also extends over top surface of the insulating material layer 116 proximate the first region, over the seed layer 118. The second region of the first metal layer 130 is also referred to herein as a first portion 131b of a connector 140, and the first region of the first metal layer 130 within the insulating material layer 116 is also referred to herein as a third portion 131a of a connector 140. The first metal layer 130 comprises an overall thickness of the first portion 131b and the third portion 131a comprising dimension $d_3$, wherein dimension $d_3$ comprises about 5 to about 50 µm in some embodiments, for example. The first portion 131b disposed over the insulating material layer 116 may comprise a dimension $d_4$, wherein dimension $d_4$ comprises about 4 to about 45 µm in some embodiments, for example. Dimensions $d_3$ and $d_4$ may also comprise other values. The top surface of the first metal layer 130 comprises a substantially planar or flat surface in some embodiments. The top surface of the first portion 131b of the connector 140 comprises a substantially flat surface, for example.

Figure 3A:
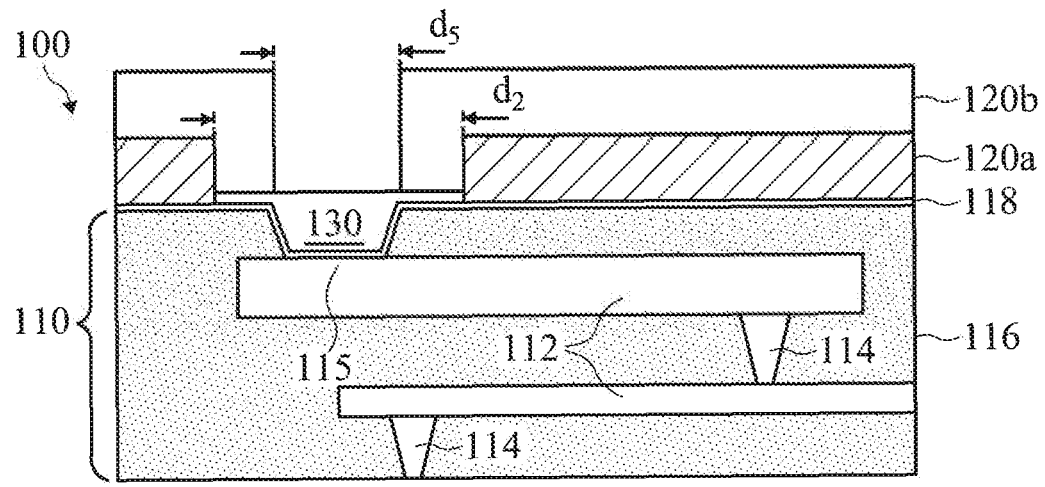
Figure 3B:
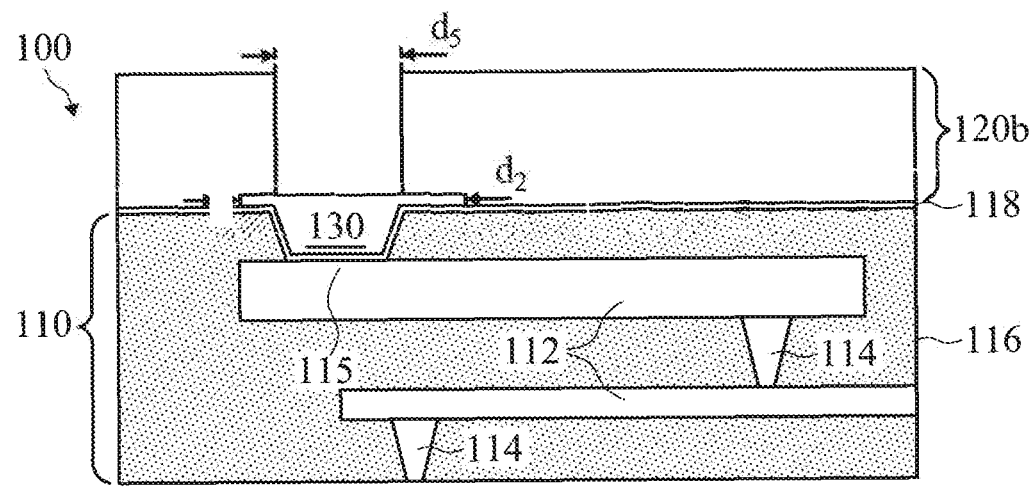

A second layer of photoresist 120b is then applied to the packaged semiconductor device 100, as illustrated in FIGS. 3a and 3b. The second layer of photoresist 120b may comprise similar dimensions as described for the first layer of photoresist 120a, for example. In some embodiments, the second layer of photoresist 120b is formed or deposited over the first layer of photoresist 120a, as shown in FIG. 3a. In some embodiments shown in FIG. 3b, the first layer of photoresist 120a is removed using an ashing, strip, or etch process, and the second layer of photoresist 120b is formed over the top surface of the seed layer 118 and the first metal layer 130.

Figure 6:
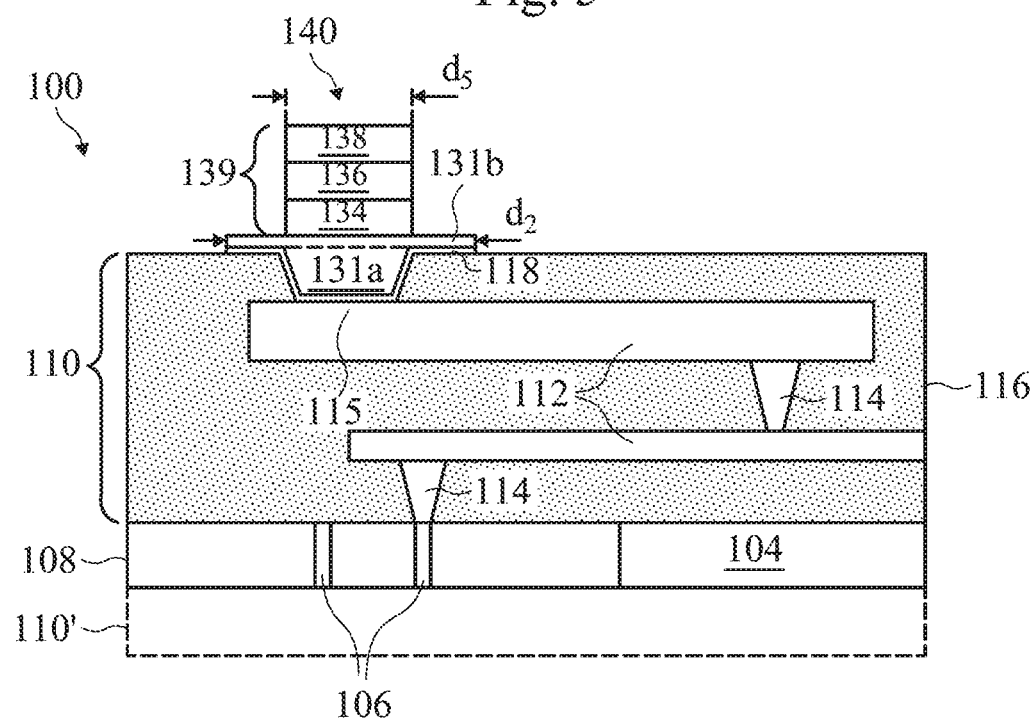

The second layer of photoresist 120b is patterned using photolithography for a pattern for a second portion 139 of the connectors 140 (see FIG. 6). The patterns in the second layer of photoresist 120b may comprise similar shapes in a top view as described for the patterns in the first layer of photoresist 120a, for example. The patterns in the second layer of photoresist 120b may comprise a width comprising dimension $d_5$, wherein dimension $d_5$ comprises about 10 µm to about 35 µm in some embodiments, for example. Dimension $d_5$ may comprise about 10 µm to about 35 µm in some microbump applications, for example. Dimension $d_5$ may be greater than 35 µm in other connector applications, such as $C_4$ or BGA, as examples. Dimension $d_5$ may also comprise other values.

Dimension $d_5$ may be about 2 µm to about 10 µm less than dimension $d_2$ comprising the width of the first portion 131b of the connector 140 within the first metal layer 130 in some embodiments, for example. Dimension $d_5$ may also comprise other relative values. Dimension $d_5$ is also referred to herein as a second width, for example. Dimension $d_5$ being less than dimension $d_2$ by about 2 µm to about 10 µm assists in and is effective in ensuring that a substantially planar and flat surface is formed on the first metal layer 130 in order to prevent or reduce underdevelopment of the second layer of photoresist 120b in some embodiments, for example.

Figure 4A:
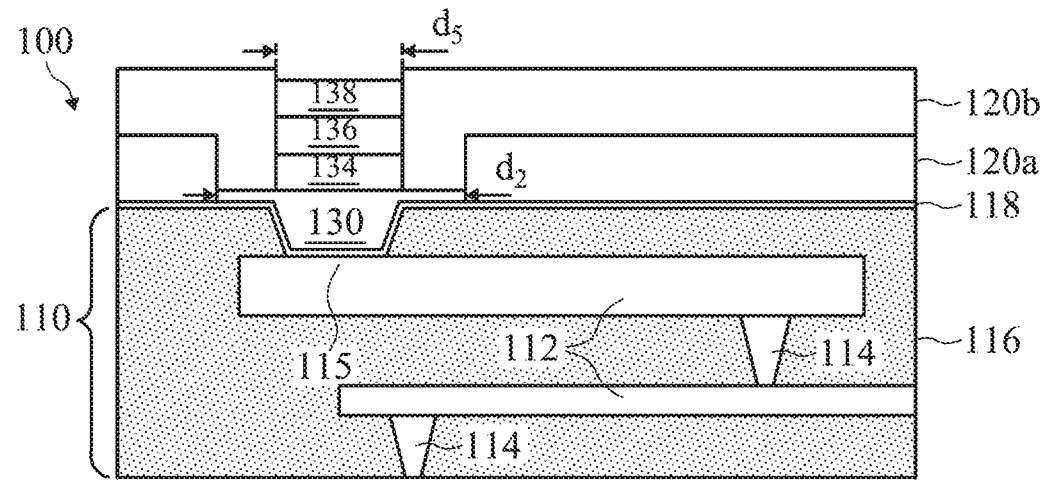
Figure 4B:
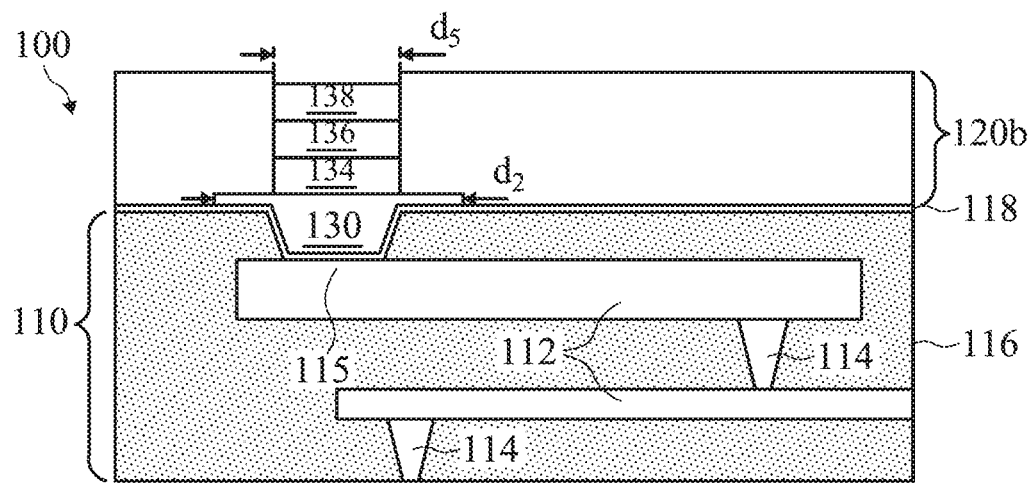

In FIGS. 4a and 4b, a plurality of metal layers 134, 136, and 138 are plated over the first metal layer 130 through the patterned second layer of photoresist 120b in some embodiments. Each metal layer functions as a seed layer for the subsequently formed metal layer in some embodiments. For example, metal layer 130 may function as a seed layer for metal layer 134, metal layer 134 may function as a seed layer for metal layer 136, and metal layer 136 may function as a seed layer for metal layer 138. In some embodiments, metal layer 134 and/or metal layer 136 are not included. Metal layer 138 is also referred to herein as a second metal layer, and metal layers 134 and 136 are also referred to herein as third or fourth metal layers. The plurality of metal layers 134, 136, and/or 138 may also be considered to be a second metal layer, in some embodiments.

Metal layer 134 comprises a thickness of about 0 µm to about 10 µm of Cu, Ni, or solder in some embodiments. Metal layer 136 comprises a thickness of about 0 µm to about 10 µm of Ni, Cu, or solder in some embodiments. Metal layer 138 comprises a thickness of about 3 µm to about 50 µm of SnAg or solder in some embodiments. Metal layers 134, 136, and 138 may also comprise other materials and dimensions. In some embodiments, metal layer 134 or metal layer 136 comprises Ni, which may avoid or prevent a Kirkendall void from occurring between the various metal layers, for example.

The metal layer 138 of the connectors 140 comprises a eutectic material such as solder in some embodiments. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials may be formed from SnCu compounds as well, without the use of silver (Ag). Lead-free solder connectors may also include tin and silver, Sn—Ag, without the use of copper.

Figure 5:
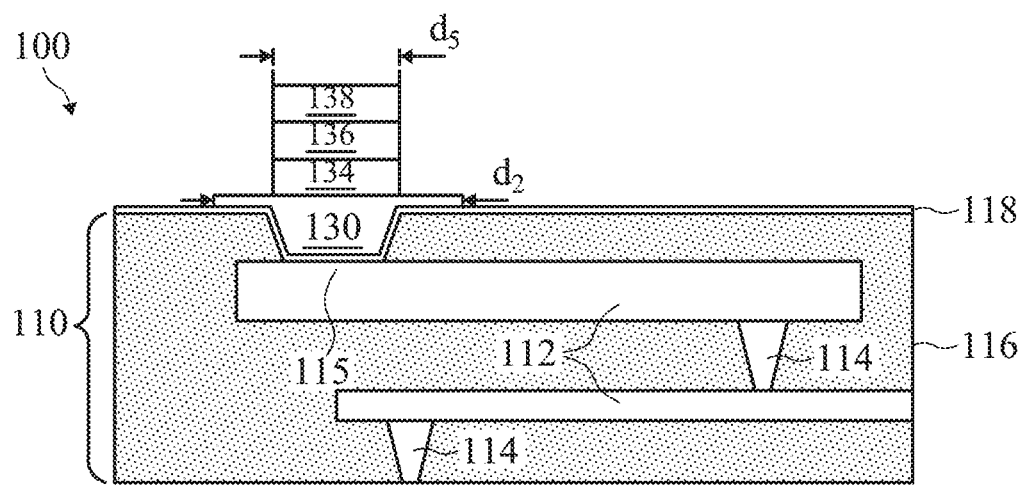

The second layer of photoresist 120b (shown in FIG. 4b), or the second layer of photoresist 120b and the first layer of photoresist 120a (shown in FIG. 4a), are removed using an ashing, stripping and/or etch process, as shown in FIG. 5. In FIG. 6, exposed portions of the seed layer 118 that were covered by the second layer of photoresist 120b and also the first layer of photoresist 120a, if the first layer of photoresist 120a was left remaining, are then removed using a suitable etch process, leaving a second portion 139 of the connector 140 formed over the first portion 131b of the connector 140, as shown in FIG. 6. The connector 140 also includes a third portion 131a disposed beneath the first portion 131b in some embodiments, wherein the third portion 131a comprises the first metal layer 130 disposed within the insulating material layer 116.

The second width of the second portion 139 of the connector 140 comprising dimension $d_5$ is less than the first width of the first portion 131b of the connector 140 comprising dimension $d_2$ in some embodiments. The third portion 131a of the connector 140 comprises a third width comprising dimension $d_0/d_1$ (not labeled in FIG. 6; see FIG. 1), wherein the third width is less than the first width of the first portion 131b of the connector 140 comprising dimension $d_2$ in some embodiments.

The substantially planar and flat top surface of the first portion 131b of the connector 140 advantageously may improve the formation of the second portion 139 of the connector 140 and improve reliability of the connector 140 in some embodiments. For example, underdevelopment of the second layer of photoresist 120b may be advantageously prevented by the planar and flat top surface of the first portion 131b of the connector 140.

After the connectors 140 are formed, the carrier 102 is then removed in some embodiments, as shown in FIG. 6. In some embodiments, a plurality of packaged semiconductor devices 100 is formed simultaneously over the carrier 102, and the plurality of packaged semiconductor devices 100 is singulated to form the packaged semiconductor devices 100. The plurality of packaged semiconductor devices 100 may be singulated using a saw or laser (not shown), which may include a blade comprising diamond or other materials in some embodiments, for example.

In some embodiments, the interconnect structure 110 comprises a first interconnect structure, and a second interconnect structure 110', shown in phantom (e.g., in dashed lines) in FIG. 6, is formed on an opposite side of the packaged semiconductor device 100 than the first interconnect structure 110. For example, a second carrier (not shown) may be coupled to a plurality of the connectors 140, the carrier 102 shown in FIG. 1 is then removed, and the second interconnect structure 110' is then formed on the molding material 108, through-vias 106, and integrated circuit die(s) 104. The second carrier is then removed.

In some embodiments of the present disclosure illustrated in FIGS. 1 through 6, the connectors 140 comprise a first portion 131b having a first width comprising dimension $d_2$, a second portion 139 having a second width comprising dimension $d_5$, wherein the second width is less than the first width. In some embodiments shown in FIGS. 7 through 13, connectors 140' are formed that comprise the second width comprising dimension $d_5$, and a connector mounting region 132 on the interconnect structure 110 comprises the first width comprising dimension $d_2$, wherein the second width is less than the first width, which will be described next herein.

Referring next to FIG. 7, a method of forming connectors 140' on an interconnect structure 110 of a packaged semiconductor device 100 includes first, providing a packaged semiconductor device 100 including an interconnect structure 110 described herein, which was shown in and described for FIG. 1. Openings 117' are formed in the upper-most insulating material layer 116 of the interconnect structure 110 using a lithography process, by depositing a first layer of photoresist 120a, and patterning the layer of photoresist 120a using photolithography with a desired pattern for the openings 117'. The first layer of photoresist 120a is then used as an etch mask during an etch process for the insulating material layer 116. Only one opening 117' is shown in the drawings: a plurality of openings 117' may be formed in the upper-most insulating material layer 116 of the interconnect structure 110, as described for the previous embodiments. The first layer of photoresist 120a is then removed. The openings 117' may also be formed using a laser drilling process, as another example.

The opening 117' exposes and is disposed over a connector mounting region 132 of the interconnect structure 110. The connector mounting region 132 comprises a conductive feature of the interconnect structure 110 and has a substantially planar and flat surface. The opening 117' and connector mounting region 132 may have a first width comprising dimension $d_2$ proximate a conductive feature of the interconnect structure 110, such as a conductive line 112, conductive via 114, or landing pad 115 that is coupled to a conductive line 112 or conductive via 114. The opening 117' may have a tapered profile or substantially straight sidewalls within the insulating material layer 116, as described for the opening 117 in the previous embodiments. The opening 117' may comprise similar shapes as described for the opening 117 in the previous embodiments.

Figure 9:
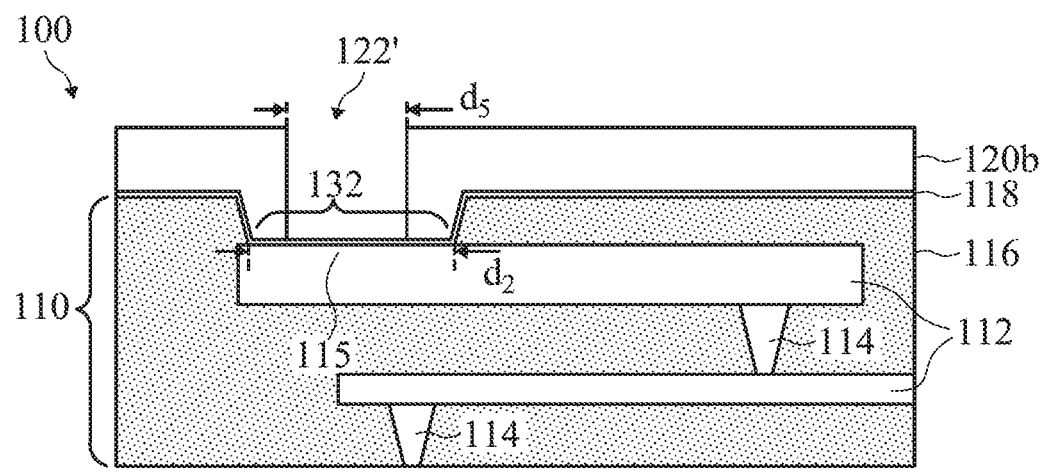

A seed layer 118 is formed over the patterned upper-most insulating material layer 116 and over the exposed portion of the conductive feature comprising the connector mounting region 132, such as the conductive line 112, conductive via 114, or landing pad 115, as illustrated in FIG. 9. The seed layer 118 may comprise similar materials and dimensions as previously described herein.

A second layer of photoresist 120b is formed over the seed layer 118, also shown in FIG. 9. The second layer of photoresist 120b is patterned using lithography, forming an opening 122' in the second layer of photoresist 120b over a portion of the connector mounting region 132. The opening 122' may comprise a second width comprising dimension $d_5$.

Figure 10:
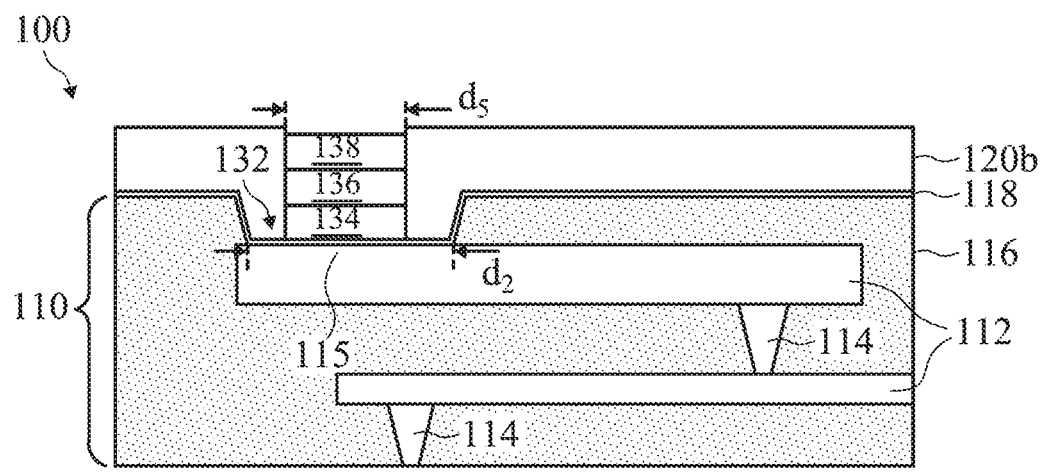
Figure 11:
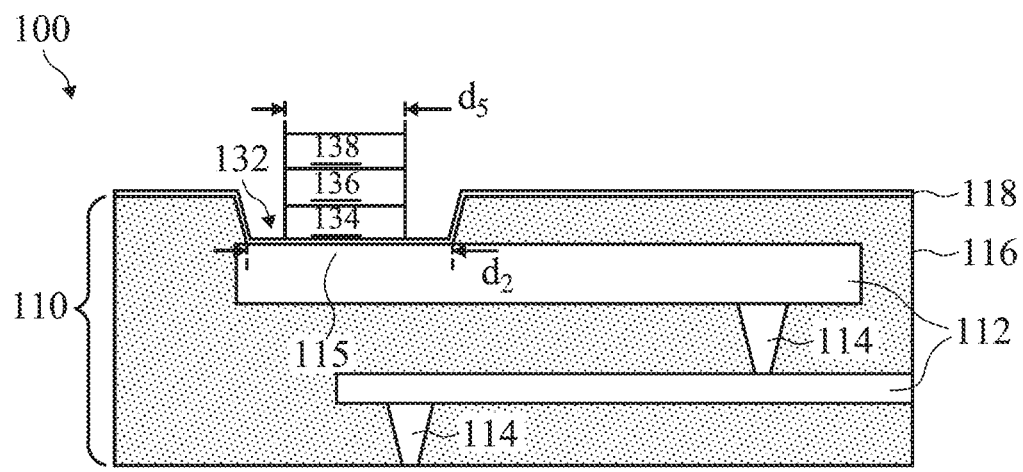
Figure 12:
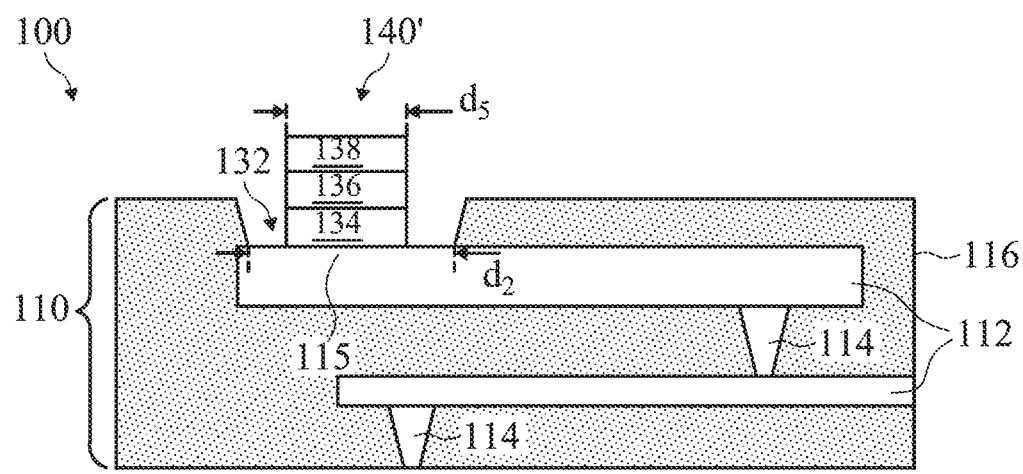

Referring next to FIG. 10, a plurality of metal layers 134, 136, and 138 are plated over a portion of the connector mounting region 132 (e.g., over the seed layer 118 disposed over the connector mounting region 132) through the patterned second layer of photoresist 120b in some embodiments. The second layer of photoresist 120b is removed, as shown in FIG. 11, and portions of the seed layer 118 that were covered by the second layer of photoresist 120b are removed, as shown in FIG. 12, leaving a connector 140' comprised of the plurality of metal layers 134, 136, and 138 coupled to the connector mounting region 132. The connector 140' comprises a second width comprising dimension $d_5$ that is less than the first width comprising dimension $d_2$ of the connector mounting region 132.

Because the connector mounting region 132 has a substantially planar and flat top surface, underdevelopment of the second layer of photoresist 120b may be advantageously prevented, which may improve the formation of the connector 140' and improve reliability of the connector in some embodiments, for example.

Figure 13:
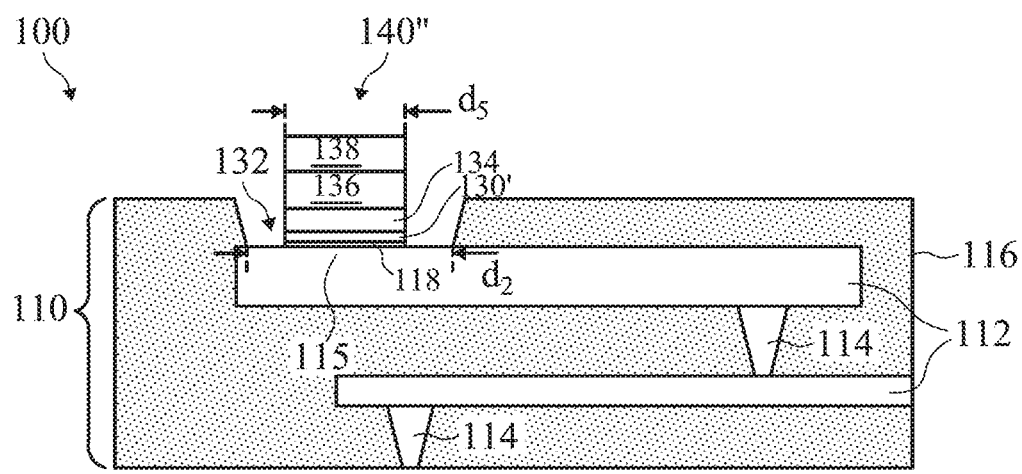
FIG. 13 is a cross-sectional view of a portion of a packaged semiconductor device that illustrates a connector in accordance with some embodiments.
Figure 14:
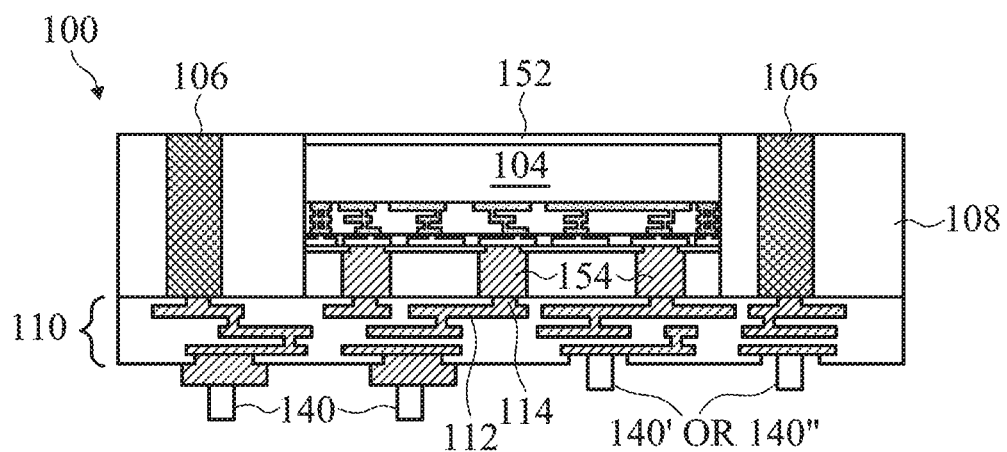
FIG. 14 is a cross-sectional view illustrating a packaged semiconductor device in accordance with some embodiments that includes the connectors.

FIG. 13 is a cross-sectional view of a portion of a packaged semiconductor device 100 that illustrates a connector 140" in accordance with some embodiments. The connector 140" includes a first metal layer 130' described herein that is plated over the connector mounting region 132 through the patterned second layer of photoresist 120b shown in FIG. 10 before metal layers 134, 136, and 138 are successively plated through the patterned second layer of photoresist 120b. The first metal layer 130' of the connector 140" also comprises a width comprising dimension $d_5$, which comprises the second width.

The connectors 140 (FIG. 6), 140' (FIGS. 12), and 140" (FIG. 13) may be pillar-shaped with substantially straight sidewalls, and may have a height of about 10 μm to about 40 μm or less in some embodiments, for example. The connectors 140, 140', and 140" may also comprise other dimensions and shapes. The connectors 140, 140', and 140" may comprise microbumps that are adapted to be utilized on a fine pitch, such as about 50 µm to about 100 µm or less, for example. The connectors 140 may be included in an array of the connectors 140, 140', and 140" on a packaged semiconductor device 100 as a grid, similar to a "ball grid array" or "BGA" arrangement. The connectors 140, 140', and 140" may also be arranged in other shapes.

In the embodiments shown in FIGS. 1 through 13, the molding material 108 and components within the molding material 108 are formed first over a carrier 102, the interconnect structure 110 is formed over the molding material 108 and components within the molding material 108, and then connectors 140 are formed over the interconnect structure 110. For example, FIG. 14 is a cross-sectional view illustrating a packaged semiconductor device 100 in accordance with some embodiments that includes the connectors 140,140' and 140". The packaged semiconductor device 100 is inverted from the views shown in the previous drawings, for example. A packaged semiconductor device 100 may include the same type of connectors 140,140' or 140", or a packaged semiconductor device 100 may include two or more types of the connectors 140, 140', or 140" described herein. Some embodiments are illustrated wherein the integrated circuit die or dies 104 are located in a substantially central region of the package, and through-vias 106 are disposed around the edges of the package.

FIG. 14 also illustrates that the DAF or adhesive 152 disposed on the integrated circuit die(s) 104 may be left remaining in the packaged semiconductor device 100 after the packages are removed from the carrier 102 and singulated. The DAF or adhesive 152 may also be removed, not shown. Also illustrated are contacts 154 of the integrated circuit die(s) 104 that are coupled to conductive features of the interconnect structure 110, such as vias 114 in the embodiments shown.

Figure 15:
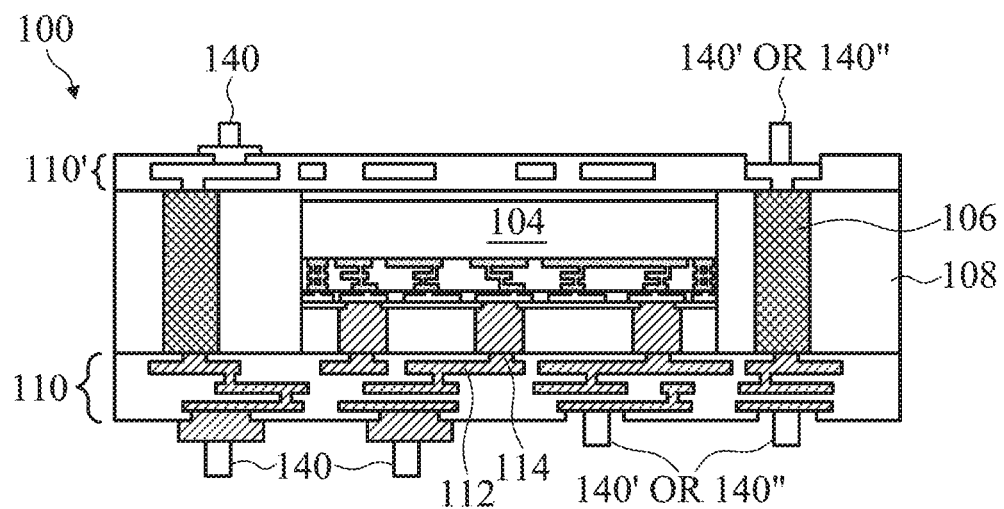
FIG. 15 is a cross-sectional view illustrating a packaged semiconductor device in accordance with some embodiments that includes the connectors.

In some embodiments, the interconnect structure 110 comprises a first interconnect structure 110, and a second interconnect structure 110' is formed on an opposite side of the molding material 108 and components within the molding material 108, as illustrated in FIG. 15, which is a cross-sectional view illustrating a packaged semiconductor device 100 in accordance with some embodiments. In some embodiments, an interconnect structure 110 may be formed over a carrier, and then the molding material 108 and components within the molding material 108 may be formed over the interconnect structure 110. A second interconnect structure 110' may then be formed over the molding material 108 and components within the molding material 108, and the connectors 140,140', and/or 140" may be formed on the second interconnect structure 110'. The connectors 140, 140', and/or 140" may or may not also be formed on the first interconnect structure 110, in these embodiments. In the embodiments shown in FIG. 15, connectors 140,140', and/or 140" are formed on both the first interconnect structure 110 and the second interconnect structure 110'.

The first interconnect structure 110 and the second interconnect structure 110' may provide electrical connections in a horizontal direction for the packaged semiconductor device 100 in some embodiments, for example. The second interconnect structure 110' may comprise back-side routing, and the first interconnect structure 110 may comprise front-side routing, or vice versa, e.g., relative to the integrated circuit die(s) 104, for the packaged semiconductor device 100 in some embodiments.

A plurality of the connectors 140 and/or a plurality of the connectors 140' or 140" may be used to couple the packaged semiconductor device 100 to another device, another packaged semiconductor device 100, or to a board or other object in an end application, for example. The plurality of connectors 140 and/or the plurality of connectors 140' or 140" may be used to couple the first interconnect structure 110 or the second interconnect structure 110', respectively, of the packaged semiconductor device 100 to a packaged integrated circuit, as another example.

Or, in other embodiments, an interconnect structure 110 may be formed first over a carrier, and the molding material 108 and components within the molding material 108 may be formed over the interconnect structure 110. Another carrier may be attached to the molding material 108 and components within the molding material 108, and the first carrier may be removed. The connectors 140, 140', and/or 140" may then be formed on the interconnect structure 110 using the methods described herein.

The methods described herein of using various carriers to package semiconductor devices and form connectors 140, 140', and/or 140" are merely examples: other orders of a packaging process may also be used to fabricate and package the packaged semiconductor devices 100 and form the connectors 140, 140', and/or 140" described herein.

Figure 16:
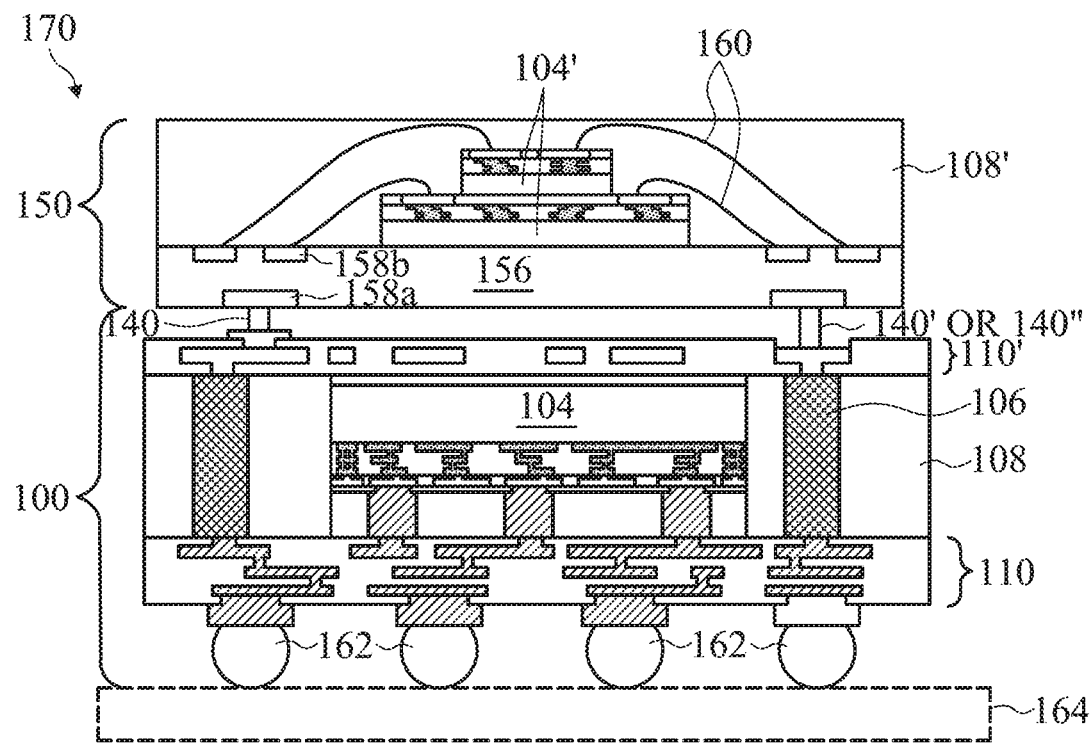
FIG. 16 shows a cross-sectional view of a package-on-package (POP) device in accordance with some embodiments that includes the connectors.

In some embodiments wherein a second interconnect structure 110' is included, another packaged integrated circuit or semiconductor device may be coupled to the first interconnect structure 110 and/or the second interconnect structure 110' of the packaged semiconductor device 100, for example. For example, FIG. 16 shows a cross-sectional view of a package-on-package (POP) device 170 in accordance with some embodiments that includes the connectors 140, 140', and/or 140". The POP device 170 includes a packaged semiconductor device 100 that is inverted from the views shown in FIGS. 1 through 13, for example. The POP device 170 includes the packaged semiconductor device 100 that has been coupled to another packaged semiconductor device 150 using a plurality of connectors 140, 140', and/or 140" coupled to the second interconnect structure 110'. The packaged semiconductor devices 100 are also referred to herein as first packaged semiconductor devices, and the packaged semiconductor devices 150 are also referred to herein as second packaged semiconductor devices. In other embodiments, a plurality of connectors 140, 140', and/or 140" may be used for chip to package interconnect.

Figure 17:
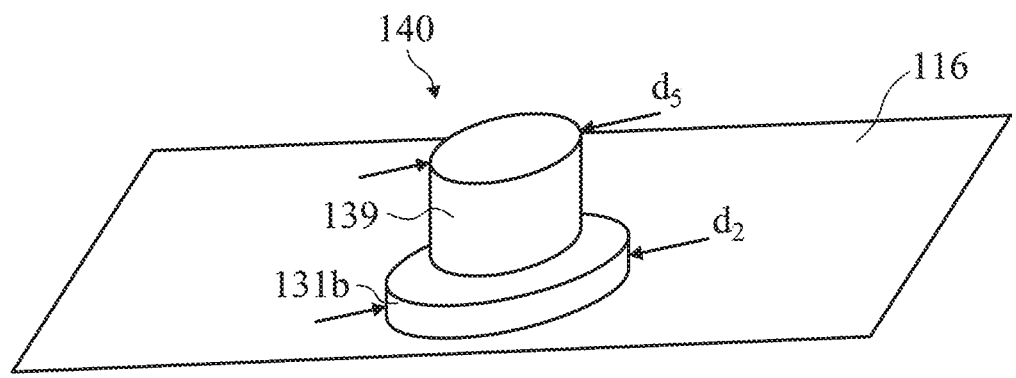
FIGS. 17 and 18 illustrate perspective views of the connectors described herein in accordance with some embodiments.

To manufacture the POP device 170, in some embodiments, before the first packaged semiconductor devices 100 are singulated, and after the second interconnect structure 110' is formed and the connectors 140, 140', and/or 140" are formed, a plurality of the second packaged semiconductor devices 150 is provided, and each of the plurality of second packaged semiconductor devices 150 is coupled to one of the first packaged semiconductor devices 100 using the plurality of connectors 140, 140', and/or 140". The plurality of second packaged semiconductor devices 150 is coupled to the unsingulated plurality of first packaged semiconductor devices 100 by a method such as manually by an operator or technician, by use of an automated machine such as a pick-and-place machine, or other methods. The eutectic material of the connectors 140, 140', and/or 140" is heated (e.g., the eutectic material of metal layer 138 of the connectors 140, 140', and/or 140"), reflowing the eutectic material, and after the eutectic material cools, the second packaged semiconductor devices 150 are electrically and mechanically coupled to the first packaged semiconductor devices 100. The plurality of first packaged semiconductor devices 100 is then singulated to form a plurality of the POP devices 170, one of which is illustrated in FIG. 17.

The second packaged semiconductor device 150 may comprise a substrate 156 that includes a plurality of contact pads 158a and 158b disposed on. A plurality of contact pads 158a is disposed on a bottom surface of the substrate 156, and a plurality of contact pads 158b is disposed on a top surface of the substrate 156 in FIG. 17, for example. The substrate 156 may include one or more interconnect structures (not shown) formed thereon that provide horizontal connections for the second packaged semiconductor device 150 in some embodiments. The substrate 156 may also include a plurality of through-vias (also not shown) formed therein. One or more integrated circuit dies 104' may be coupled to a top surface of the substrate 156. The second packaged semiconductor device 150 comprises two vertically stacked integrated circuit dies 104' in some of the embodiments shown in FIG. 16, for example. Two or more integrated circuit dies 104' may also be packaged together horizontally in the second packaged semiconductor device 150 in some embodiments, not shown.

In some of the embodiments shown in FIG. 16, the integrated circuit dies 104' are coupled to the plurality of contact pads 158b disposed on the top surface of the substrate 156 by bond wires 160. The bond wires 160 and through-vias in the substrate 156, if included, provide vertical electrical connections for the second packaged semiconductor device 150 in some embodiments. A molding material 108' is disposed over the integrated circuit dies 104', the bond wires 160, and the substrate 156. The molding material 108' may comprise similar materials and formation methods as described for the molding material 108 of the first packaged semiconductor device 100, for example.

In some embodiments, the integrated circuit die or dies 104' of the second packaged semiconductor device 150 may comprise memory devices, such as dynamic random access memory (DRAM) devices, for example. The integrated circuit dies 104' may also comprise other types of memory devices and/or other types of devices. The integrated circuit dies 104' may be packaged in a wire bond type of package as shown in FIG. 16, or the integrated circuit dies 104' may be packaged in other types of packages and using other types of packaging techniques. The second packaged semiconductor device 150 may also comprise a similar type or the same type of package as the first packaged semiconductor device 100, as an example.

FIG. 16 also illustrates that one of the interconnect structures 110 or 110' may have a different type of connector 162 coupled thereto than the connectors 140, 140', and/or 140" described herein. For example, connectors 162 comprising solder balls or solder bumps are illustrated being connected to the first interconnect structure 110. Other types of connectors may also be used, or the connectors 140, 140', and/or 140" described herein may also be coupled to the first interconnect structure 110, as illustrated in FIG. 15.

The POP device 170 may be coupled to another device or object using the plurality of connectors 162 disposed on the bottom surface of the POP devices 170 that are coupled to the interconnect structure 110, e.g., using a surface mount technology (SMT) process. In some embodiments, the POP devices 170 may be coupled to a substrate or PCB 164, as shown in phantom in FIG. 16, forming a chip-on-wafer-on-substrate (CoWoS) device. Likewise, a first packaged semiconductor device 100 may also be coupled to a substrate or PCB 164 using the connectors 140,140', and/or 140", without being coupled to a second packaged semiconductor device 150, not shown.

In some embodiments, the integrated circuit dies 104 of the first packaged semiconductor device 100 may comprise logic devices or processors, and the interconnect structure 110 of the first packaged semiconductor device 100 comprises fan-out wiring, e.g., in some embodiments wherein the second integrated circuit dies 104' comprise memory devices such as DRAM devices, forming an InFO POP device 170. The integrated circuit dies 104, the integrated circuit dies 104', the first packaged semiconductor device 100, and the second packaged semiconductor device 150 may also comprise other types of devices, and the connectors 140, 140', and/or 140" described herein may also be implemented in other types of applications.

Figure 18:
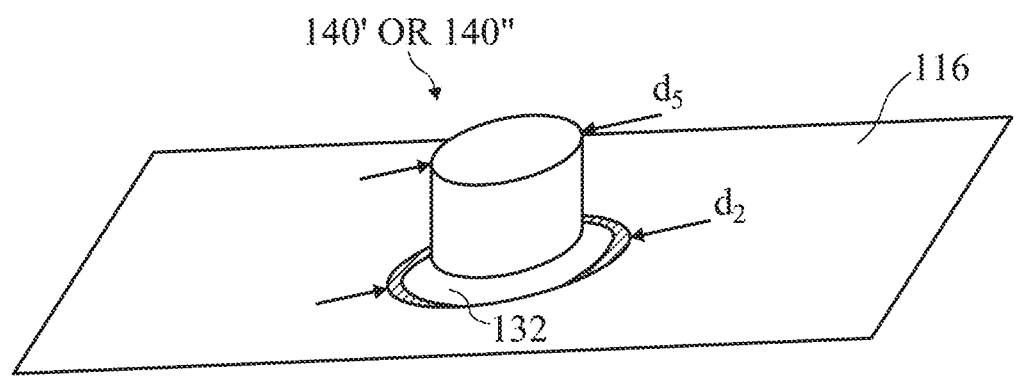

FIGS. 17 and 18 illustrate perspective views of the connectors 140 and 140' described herein in accordance with some embodiments. In FIG. 17, a connector 140 shown in FIG. 6 is illustrated wherein the first portion 131b and second portion 139 of the connector 140 comprises a circular shape in a top view. The first portion 131b is elevated above a surface of the insulating material layer 116, and the second portion 139 is coupled to the first portion 131b. In FIG. 18, a connector 140' or 140" shown in FIGS. 12 and 13, respectively, is illustrated, wherein a lower portion of the connectors 140' or 140" is coupled to a connector mounting region 132 below a surface of the insulating material layer 116. A circular shaped connector 140' or 140" is shown, and other shapes may also be used.

Figure 19:
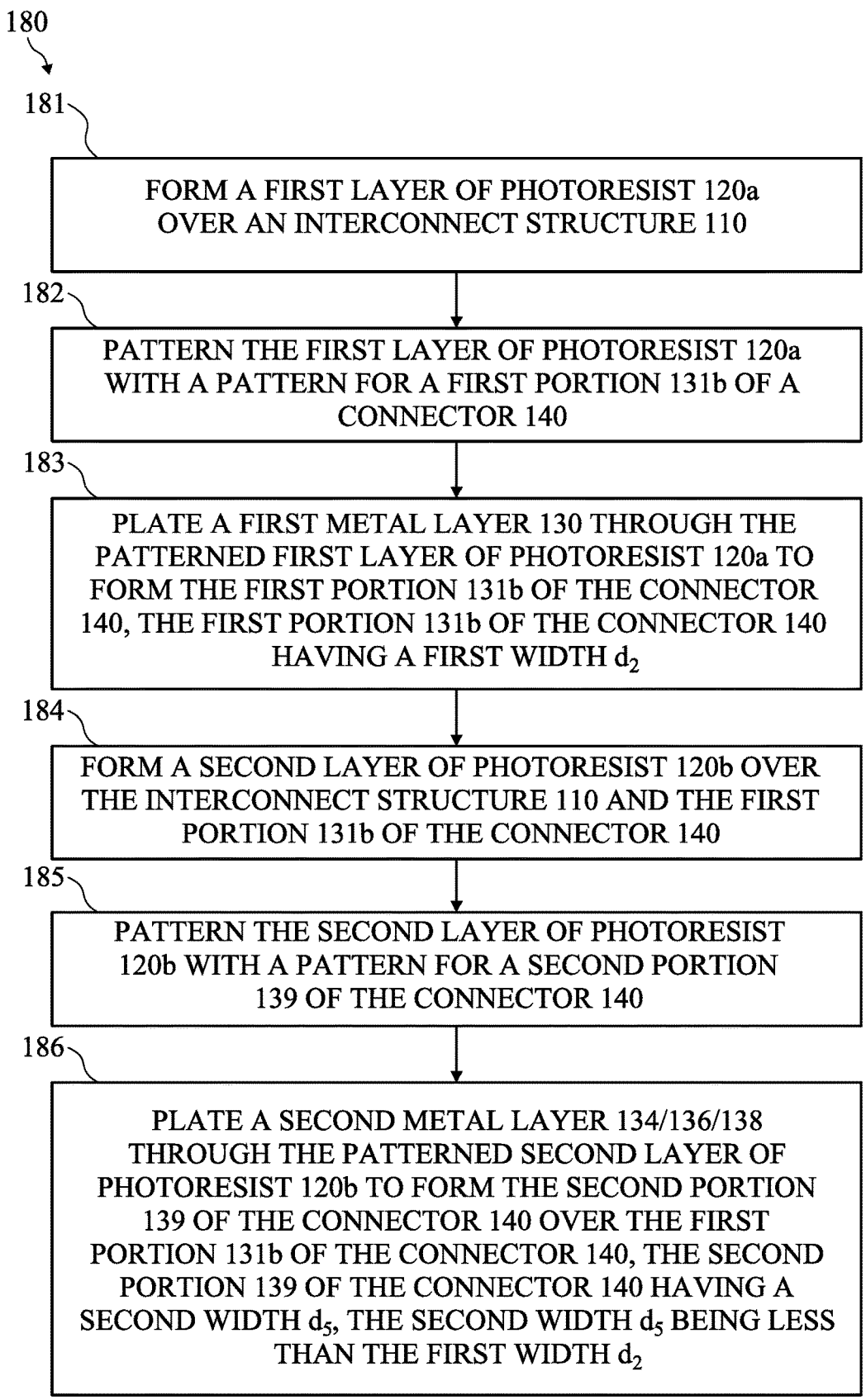
FIG. 19 is a flow chart that illustrates a method of forming connectors in accordance with some embodiments.

FIG. 19 is a flow chart 180 that illustrates a method of forming connectors 140 in accordance with some of the embodiments shown in FIGS. 1 through 6. In step 181, a first layer of photoresist 120a is formed over an interconnect structure 110 (FIG. 1), and the first layer of photoresist 120a is patterned with a pattern for a first portion 131b of a connector 140 in step 182 (FIG. 1). In step 183, a first metal layer 130 is plated through the patterned first layer of photoresist 120a to form the first portion 131b of the connector 140 (FIG. 2), the first portion 131b of the connector 140 having a first width $d_2$. In step 184, a second layer of photoresist 120b is formed over the interconnect structure 110 and the first portion 131b of the connector 140 (FIG. 3a or 3b). In step 185, the second layer of photoresist 120b is patterned with a pattern for a second portion 139 of the connector 140 (FIG. 3a or 3b). In step 186, a second metal layer 134/136/138 (or at least metal layer 138) is plated through the patterned second layer of photoresist 120b to form the second portion 139 of the connector 140 over the first portion 131b of the connector 140 (FIG. 4a or 4b), the second portion 139 of the connector 140 having a second width $d_5$, the second width $d_5$ being less than the first width $d_2$.

In some embodiments, plating the second metal layer described in step 186 comprises plating a plurality of metal layers 134 and 138, 136 and 138, or 134, 136, and 138. In some embodiments, a seed layer 118 is formed over the interconnect structure 110, before forming the first layer of photoresist 120a, as shown in FIG. 1. In some embodiments, the first layer of photoresist 120a and the second layer of photoresist 120b are removed after plating the second metal layer in step 186, and portions of the seed layer 118 that were covered by the patterned first layer of photoresist 120a are removed, as shown in FIGS. 5 and 6. In some embodiments, the first layer of photoresist 120a is removed before forming the second layer of photoresist 120b, as shown in FIG. 4b. In some embodiments, forming the second layer of photoresist 120b comprises forming the second layer of photoresist 120b over the first layer of photoresist 120a, as shown in FIG. 4a. In some embodiments, an opening 117 is formed in an insulating material layer 116 of the interconnect structure 110 to expose a portion of a conductive feature of the interconnect structure 110 before forming the first layer of photoresist 120a (see FIG. 1), and plating the first metal layer 130 further comprises plating the first metal layer 130 through the opening 117 in the insulating material layer 116, as shown in FIG. 2. The connector 140 may further comprise a third portion 131a disposed beneath the first portion 131b within the insulating material layer 116, wherein the third portion 131a comprises a third width comprising dimensions $d_0/d_1$, the third width being less than the first width $d_2$ (see FIGS. 1 and 2).

FIG. 20 is a flow chart 190 that illustrates a method of forming connectors 140' on a packaged semiconductor device 100 in accordance with some embodiments of the present disclosure shown in FIGS. 7 through 12. In step 191, packaged semiconductor device 100 comprising an integrated circuit die 104, a molding material 108 disposed around the integrated circuit die 104, and an interconnect structure 110 disposed over the integrated circuit die 104 and the molding material 108 is provided (not shown in FIG. 7; see FIG. 1). In step 192, a plurality of openings 117' is formed in an insulating material layer 116 of the interconnect structure 110, wherein each of the plurality of openings 117' is disposed over a connector mounting region 132 of the interconnect structure 110, and wherein each of the connector mounting regions 132 comprises a conductive feature of the interconnect structure 110, comprises a first width $d_2$, and has a substantially planar surface (FIGS. 7 and 8). In step 193, a connector 140' is formed using a plating process over each of the connector mounting regions 132, wherein the connectors 140' comprise a second width $d_5$, and wherein the second width $d_5$ is less than the first width $d_2$ (see also FIGS. 9 through 12).

The method of forming the connectors 140' described in the flow chart 190 may also comprise forming a layer of photoresist 120b over the connector mounting regions 132 and the insulating material layer 116 of the interconnect structure 110 and patterning the layer of photoresist 120b to expose a portion of the connector mounting regions 132 as shown in FIG. 9; and plating a material 134/136/138 (at least metal layer 138) of the connectors 140' through the patterned layer of photoresist 120b as shown in FIG. 10; and removing the layer of photoresist 120b, as shown in FIG. 11. The connector 140' forming method may further comprise forming a seed layer 118 over the insulating material 116 and the connector mounting regions 132 of the interconnect structure 110, before forming the layer of photoresist 120b, as shown in FIG. 9. In some embodiments, forming the connectors 140' comprises forming a plurality of metal layers 134 and 138, 136 and 138, or 134, 136, and 138 over the connector mounting regions 132.

Figure 21:
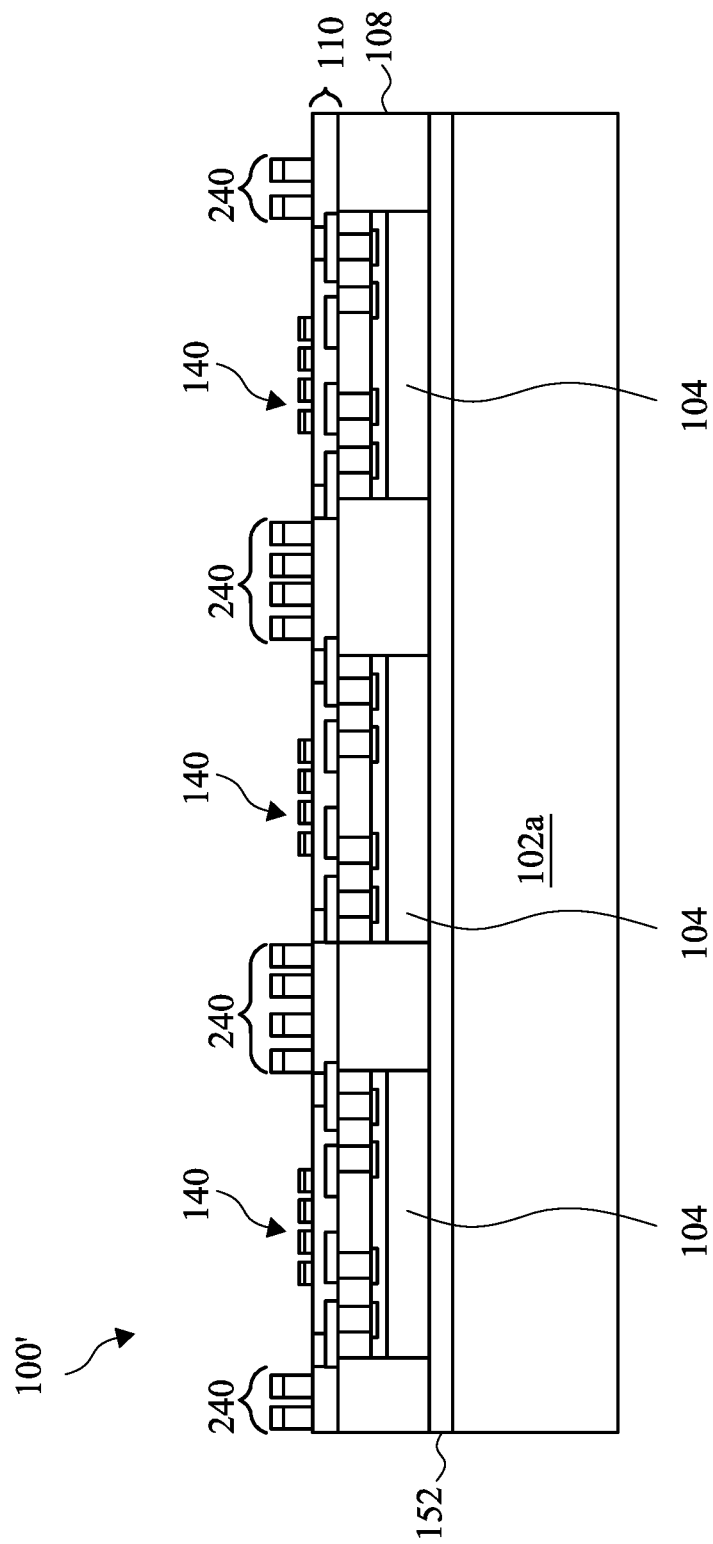
FIGS. 21 through 23 are cross-sectional views that illustrate a method of packaging semiconductor devices in accordance with some embodiments of the present disclosure.
Figure 22:
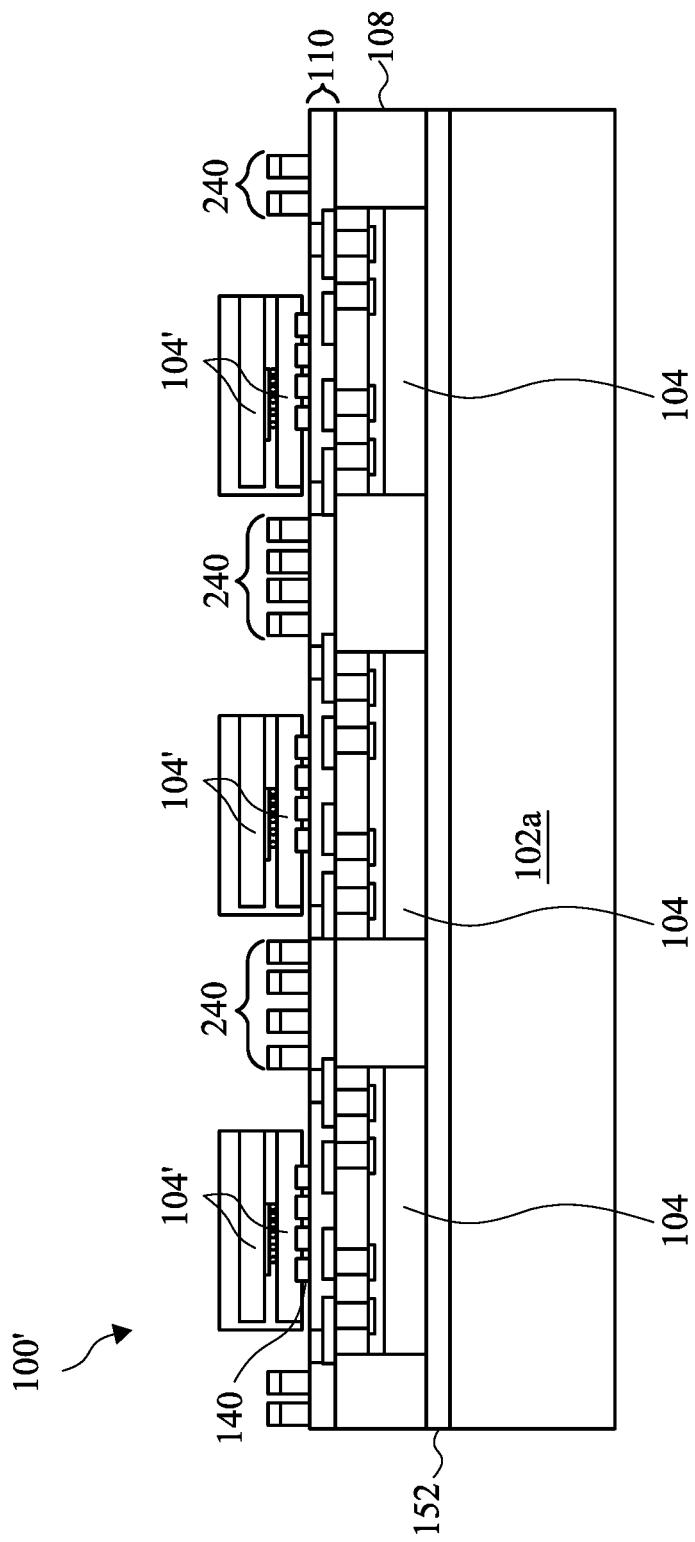
Figure 23:
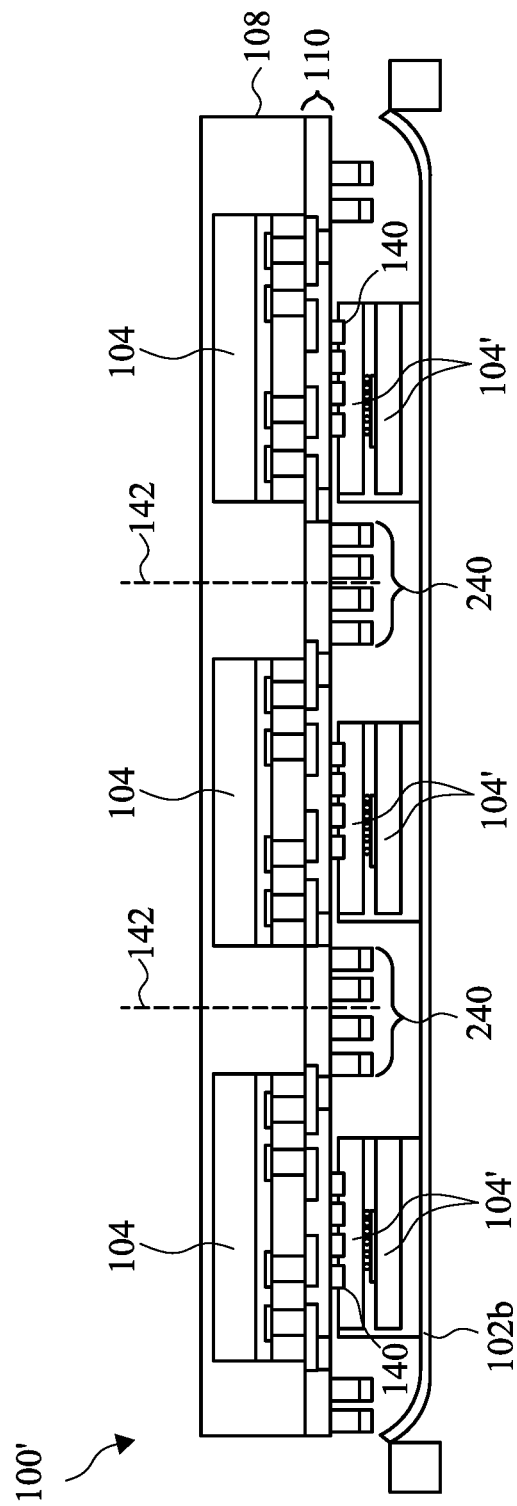

FIGS. 21 through 23 are cross-sectional views that illustrate a method of packaging semiconductor devices using the connectors 140, 140', and/or 140" described herein in accordance with some embodiments of the present disclosure. The packaging method illustrates a chip-on-integrated fan-out (CoInFo) packaging technique in accordance with some embodiments that is used to form packaged semiconductor devices 100'. In FIG. 21, a DAF or adhesive 152 is applied or laminated onto a first carrier 102a, and a plurality of integrated circuit dies 104 are placed onto the DAF or adhesive 152. A molding material 108 is formed over the integrated circuit dies 104, and excess portions of the molding material 108 are removing using a grinding or other process.

Note that through-vias (see through-vias 106 in FIGS. 1, 6, and 14 through 16) are not included in the molding material 108 in some embodiments. Likewise, through-vias may not be included in the molding material 108 in the previous embodiments described herein.

The interconnect structure 110 is formed over the integrated circuit dies 104 and the molding material 108, and the connectors 140 described herein are formed on the interconnect structure 110 over the integrated circuit dies 104 using a method described herein. The connectors 140 may also comprise the connectors 140' and 140" described herein. The connectors 140 comprise microbumps in some embodiments, for example, that are formed proximate the integrated circuit dies 104.

Connectors 240 are formed on the interconnect structure 110 around the integrated circuit dies 104. The connectors 240 may comprise $C_4$ or BGA connectors in some embodiments, as examples. The connectors 240 may also comprise other types of connectors. In some embodiments, the connectors 240 have a greater height than connectors 140. In these embodiments, the connectors 240 are formed after connectors 140 are formed by removing the photoresist 120a or 120b (see FIGS. 1 through 4a and 4b and FIGS. 7 through 10) used to form the connectors 140, and depositing another layer of photoresist (not shown) and patterning the photoresist with the pattern of the connectors 240. The connectors 240 are then plated on through the photoresist, and the photoresist and seed layer 118 (see FIG. 1) are removed. In some embodiments, the connectors 240 may have a height of about 53 µm and a width of about 83 µm, for example. The connectors 240 are positioned relative to one another by a greater pitch than connectors 140 are positioned in some embodiments. The connectors 240 may be positioned relative to one another by a pitch of about 150 µm, for example. The connectors 240 may also comprise other dimensions and relative dimensions.

In some embodiments, the connectors 240 may comprise substantially the same size as connectors 140, and the connectors 240 may be formed simultaneously with the formation of connectors 140.

Referring next to FIG. 22, an integrated circuit die 104' is then coupled to the connectors 140. In some embodiments, a stack of two or more integrated circuit dies 104' is coupled to the connectors 140 that are disposed over the integrated circuit dies 104, as illustrated in FIG. 22. Each stack of integrated circuit dies 104' is disposed over one of the integrated circuit dies 104, for example. In some embodiments, integrated circuit dies 104 comprise logic devise, and integrated circuit dies 104' comprise memory devices, as an example. The dies 104 and 104' may also comprise other types of devices.

The stacked integrated circuit dies 104' are then coupled to a second carrier 102b which comprises a tape or other type of carrier, and the first carrier 102a and the DAF or adhesive 152 are removed. The packaged semiconductor devices 100' are then singulated using a die saw along singulation lines 142, and the second carrier 102b is removed. The packaged semiconductor device 100' may then be coupled or attached to another device, such as a substrate, for example, using connectors 240 disposed proximate the perimeter of the packaged semiconductor device 100'.

Some embodiments of the present disclosure are advantageously implementable in and are particularly beneficial when used in WLP processes and applications. Some embodiments of the present disclosure are advantageously implementable in and are particularly beneficial when used in POP or chip on package (CoP) devices, in some applications. Packaged semiconductor devices that include the connectors described herein formed thereon may be implemented in POP or CoP devices, system-on-a chip (SOC) devices, CoWoS devices, or other types of three dimensional integrated circuits (3 DICs) in some embodiments, as examples. Some embodiments of the present disclosure are also beneficial for and may be implemented in other types of devices that include interconnect structures and fan-out structures, or that utilize connectors, as other examples.

Some embodiments of the present disclosure include methods of forming connectors. Some embodiments include methods of forming connectors on packaged semiconductor devices, and packaged semiconductor devices that include the connectors.

Some advantages of some embodiments of the present disclosure include providing connectors that are formed using plating processes over connector mounting regions that have a substantially planar or flat surface, which prevents or reduces underdevelopment of photoresists during lithography processes. In some embodiments, the connectors have a wider bottom portion with a flat surface which also prevents or reduces underdevelopment of photoresists during lithography processes. In some embodiments, the connectors are wider at the bottom proximate an interconnect structure that the connectors are formed on than at the top, which provides a wider solder bridge joint formation process window. A fine pitch interconnect solder bridge improvement may be achieved in some embodiments. The connectors have an even shape, which prevents or reduces bonding shift issues. Furthermore, the connector formation methods and connector structures described herein are easily implementable into existing interconnect structure and packaging process flows and structures.

In some embodiments, a method of forming a connector includes forming a first layer of photoresist over an interconnect structure, patterning the first layer of photoresist with a pattern for a first portion of a connector, and plating a first metal layer through the patterned first layer of photoresist to form the first portion of the connector. The first portion of the connector has a first width. The method includes forming a second layer of photoresist over the interconnect structure and the first portion of the connector, patterning the second layer of photoresist with a pattern for a second portion of the connector, and plating a second metal layer through the patterned second layer of photoresist to form the second portion of the connector over the first portion of the connector. The second portion of the connector has a second width, the second width being less than the first width.

In some embodiments, a method of forming connectors on a packaged semiconductor device includes providing a packaged semiconductor device comprising an integrated circuit die, a molding material disposed around the integrated circuit die, and an interconnect structure disposed over the integrated circuit die and the molding material. A plurality of openings is formed in an insulating material layer of the interconnect structure, wherein each of the plurality of openings is disposed over a connector mounting region of the interconnect structure, and wherein each of the connector mounting regions comprises a conductive feature of the interconnect structure, comprises a first width, and has a substantially planar surface. A connector is formed using a plating process over each of the connector mounting regions, wherein the connectors comprise a second width, and wherein the second width is less than the first width.

In some embodiments, a packaged semiconductor device includes an integrated circuit die and a molding material disposed around the integrated circuit die. An interconnect structure is disposed over the integrated circuit die and the molding material. The interconnect structure includes a plurality of connector mounting regions disposed thereon, wherein each of the plurality of connector mounting regions comprises a first width and has a substantially planar surface. A connector having a second width is disposed over each of the plurality of connector mounting regions, wherein the second width is less than the first width. Each of the connectors comprises a first metal layer and a second metal layer disposed over the first metal layer.

In some embodiments, a method includes steps of: forming an interconnect structure, the interconnect structure including an insulating material extending over a conductive feature; forming a first patterned mask over the insulating material, the first patterned mask having a first opening; forming a second opening in the insulating material using the first patterned mask as a mask, the second opening exposing an upper surface of the conductive feature, the second opening having a first width; forming a second patterned mask over the interconnect structure, the second patterned mask having a third opening, a width of the third opening being less than the first width; and plating a connector in the third opening of the second patterned mask, a width of the connector being less than the first width. In some embodiments, plating the connector includes plating a plurality of metal layers. In some embodiments, the method further includes, before forming the second patterned mask, forming a seed layer over the interconnect structure. In some embodiments, the method further includes removing the second patterned mask. In some embodiments, the method further includes, after removing the second patterned mask, removing portions of the seed layer that were covered by the second patterned mask. In some embodiments, the method further includes, before forming the second patterned mask, removing the first patterned mask. In some embodiments, plating the connector further includes plating a first metal layer in the third opening. In some embodiments, plating the plurality of metal layers includes: a first layer of the plurality of metal layers comprising Cu or Ni; a second layer of the plurality of metal layers comprising SnAg or solder; and a third layer of the plurality of metal layers comprising Cu, Ni, or solder, the third layer interposed between the first layer and the second layer.

In some embodiments, a packaged semiconductor device includes: an integrated circuit die; a conductive feature; an insulating material over the conductive feature, the insulating material having an opening exposing the conductive feature, the opening having a first width; and a connector extending through the opening in the insulating material to the conductive feature, the connector having a width less than the first width. In some embodiments, the connector includes a first metal layer and a second metal layer. In some embodiments, the first metal layer includes Cu or Ni. In some embodiments, the second metal layer includes SnAg or a solder material. In some embodiments, the connector includes a third metal layer interposed between the first metal layer and the second metal layer. In some embodiments, the third metal layer includes Cu, Ni, or a solder material. In some embodiments, the integrated circuit die includes a first integrated circuit die, and the packaged semiconductor device further includes a packaged second integrated circuit die coupled to the connector.

In some embodiments, a packaged semiconductor device includes: an integrated circuit die; a molding material disposed around the integrated circuit die; an interconnect structure disposed over the integrated circuit die and the molding material, the interconnect structure including a first conductive feature, a second conductive feature, and an insulating material over the first conductive feature and the second conductive feature; a first connector extending through the insulating material to the first conductive feature, sidewalls of the first connector being spaced apart from sidewalls of the insulating material; and a second connector extending through the insulating material to the second conductive feature, the second conductive feature having a first layer and a second layer on the first layer, the first layer having an uppermost surface that is above an uppermost surface of the insulating material, wherein a width of the first layer is greater than a width of the second layer. In some embodiments, the first connector includes a first metal layer, a second metal layer, and a third metal layer. In some embodiments, at least one of: the first metal layer includes Cu or Ni; the second metal layer includes SnAg or a first solder material; or the third metal layer includes Cu, Ni, or a second solder material. In some embodiments, the third metal layer is interposed between the first metal layer and the second metal layer. In some embodiments, the integrated circuit die includes a first integrated circuit die, and the packaged semiconductor device further includes a packaged second integrated circuit die coupled to the first connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an interconnect structure, the interconnect structure comprising an insulating material extending over a conductive feature;
   forming a first patterned mask over the insulating material, the first patterned mask having a first opening;
   forming a second opening in the insulating material using the first patterned mask as a mask, the second opening exposing a contact mounting region of an upper surface of the conductive feature, the second opening in the insulating material having a first width at the upper surface of the conductive feature;
   forming a second patterned mask over the interconnect structure, the second patterned mask having a third opening exposing a portion of the contact mounting region of the upper surface of the conductive feature, a second width of the third opening of the second patterned mask measured between opposite vertical sidewalls of the second patterned mask being less than the first width of the second opening in the insulating material; and
   plating a connector to the exposed portion of the contact mounting region in the third opening of the second patterned mask, a third width of the connector being less than the first width.

2. The method of claim 1, further comprising, before forming the second patterned mask, forming a seed layer over the interconnect structure.

3. The method of claim 2, further comprising removing the second patterned mask.

4. The method of claim 3, further comprising, after removing the second patterned mask, removing portions of the seed layer that were covered by the second patterned mask.

5. The method of claim 4, further comprising, before forming the second patterned mask, removing the first patterned mask.

6. The method of claim 1, wherein plating the connector comprises plating a plurality of metal layers.

7. The method of claim 6, wherein plating the plurality of metal layers comprises:
   plating a first layer of the plurality of metal layers comprising Cu or Ni;
   plating a second layer of the plurality of metal layers comprising SnAg or solder; and
   plating a third layer of the plurality of metal layers comprising Cu, Ni, or solder, the third layer interposed between the first layer and the second layer.

8. A packaged semiconductor device comprising:
   a first conductive feature and a second conductive feature;
   an insulating material over the first conductive feature and the second conductive feature, the insulating material having a first opening extending from a first contact mounting region of a first upper surface of the first conductive feature to an upper surface of the insulating material, the first opening of the insulating material having a first width at the first contact mounting region, the insulating material further having a second opening extending from a second contact mounting region of a second upper surface of the second conductive feature to the upper surface of the insulating material, the second opening of the insulating material having a second width;
   a first connector extending through the first opening in the insulating material to the first contact mounting region at the first upper surface of the first conductive feature, the first connector having a third width measured between first outer straight sidewalls of the first connector, the third width of the first connector being less than the first width of the first opening of the insulating material by 2 µm-10 µm, inclusive, bottom points of the first outer straight sidewalls of the first connector physically contacting the first upper surface of the first conductive feature; and
   a second connector extending through the second opening in the insulating material to the second contact mounting region at the second upper surface of the second conductive feature, the second connector having a fourth width measured between second outer straight sidewalls of the second connector, the fourth width of the second connector being less than the second width of the second opening of the insulating material by 2 µm-10 µm, inclusive, bottom points of the second outer straight sidewalls of the second connector physically contacting the second upper surface of the second conductive feature.

9. The packaged semiconductor device of claim 8, wherein the first connector comprises a first metal layer and a second metal layer.

10. The packaged semiconductor device of claim 9, wherein the first metal layer comprises Cu or Ni.

11. The packaged semiconductor device of claim 10, wherein the second metal layer comprises SnAg or a solder material.

12. The packaged semiconductor device of claim 9, wherein the second metal layer comprises SnAg or a solder material.

13. The packaged semiconductor device of claim 9, wherein the first connector comprises a third metal layer interposed between the first metal layer and the second metal layer.

14. The packaged semiconductor device of claim 13, wherein the third metal layer comprises Cu, Ni, or a solder material.

15. The packaged semiconductor device of claim 9, wherein the first conductive feature is coupled to a first integrated circuit die, and further comprising a packaged second integrated circuit die coupled to the first connector.

16. A packaged semiconductor device comprising:
a first integrated circuit die;
a molding material disposed around the first integrated circuit die;
an interconnect structure disposed over the first integrated circuit die and the molding material, the interconnect structure comprising a first conductive feature, a second conductive feature, and an insulating material over the first conductive feature, and the second conductive feature;
a first connector, wherein the first connector extends through a first channel of the insulating material to a first contact mounting region of a first upper surface of the first conductive feature, the first channel including first straight inner channel sidewalls extending from the first contact mounting region to an uppermost surface of the insulating material and wherein first straight outer sidewalls of the first connector are spaced apart from the first straight inner channel sidewalls of the insulating material such that interposed portions of the first contact mounting region extend between the first straight outer sidewalls of the first connector and the first straight inner sidewalls of the insulating material and such that a combined linear distance of the interposed portions of the first contact mounting region is between 2 μm-10 μm, inclusive, bottom vertices of the first straight outer sidewalls of the first connector physically contacting the first upper surface of the first conductive feature; and
a second connector, wherein the second connector extends through a second channel of the insulating material to a second contact mounting region of a second upper surface of the second conductive feature, the second channel including second straight inner channel sidewalls extending from the second contact mounting region to an uppermost surface of the insulating material and wherein second straight outer sidewalls of the second connector are spaced apart from the second straight inner channel sidewalls of the insulating material such that interposed portions of the second contact mounting region extend between the second straight outer sidewalls of the second connector and the second straight inner sidewalls of the insulating material and such that a combined linear distance of the interposed portions of the second contact mounting region is between 2 μm-10 μm, inclusive, bottom vertices of the second straight outer sidewalls of the second connector physically contacting the second upper surface of the second conductive feature.

17. The packaged semiconductor device of claim 16, further comprising:
a third conductive feature within the interconnect structure, wherein the insulating material is over the third conductive feature; and
a third connector, wherein the third connector extends through the insulating material to the third conductive feature, and the third connector includes a first layer and a second layer on the first layer, the first layer of the third connector having an uppermost surface that is above the uppermost surface of the insulating material, wherein a width of the uppermost surface of the first layer of the third connector is greater than a width of the second layer of the third connector at the uppermost surface of the first layer.

18. The packaged semiconductor device of claim 17, wherein:
the first connector comprises a first metal layer, a second metal layer, and a third metal layer;
the first metal layer comprises Cu or Ni;
the second metal layer comprises SnAg or a first solder material; and
the third metal layer comprises Cu, Ni, or a second solder material.

19. The packaged semiconductor device of claim 18, wherein the third metal layer of the first connector is interposed between the first metal layer of the first connector and the second metal layer of the first connector.

20. The packaged semiconductor device of claim 16, further comprising a packaged second integrated circuit die coupled to the first connector.

* * * * *